(12) United States Patent
Luo et al.

(10) Patent No.: US 11,574,953 B2
(45) Date of Patent: Feb. 7, 2023

(54) MOSAIC ACTIVE MATRIX DRIVEN LIGHT EMITTING DIODE (LED) DISPLAY PANEL

(71) Applicant: a.u. Vista, Inc., Irvine, CA (US)

(72) Inventors: Fang-Chen Luo, Irvine, CA (US); Jenn-Jia Su, Hsinchu (TW); Willem den Boer, Irvine, CA (US); Shih-Hsing Hung, Hsinchu (TW)

(73) Assignee: A.U. VISTA, INC., Irvine, CA (US)

( * ) Notice: Subject to any disclaimer, the term of this patent is extended or adjusted under 35 U.S.C. 154(b) by 193 days.

(21) Appl. No.: 17/007,732

(22) Filed: Aug. 31, 2020

(65) Prior Publication Data

US 2022/0068998 A1   Mar. 3, 2022

(51) Int. Cl.
| | | |
|---|---|---|
| *H01L 27/15* | (2006.01) | |
| *G09G 3/32* | (2016.01) | |
| *G06F 3/041* | (2006.01) | |
| *H01L 33/00* | (2010.01) | |
| *H01L 33/62* | (2010.01) | |

(52) U.S. Cl.
CPC .......... *H01L 27/156* (2013.01); *G06F 3/0412* (2013.01); *G09G 3/32* (2013.01); *H01L 33/005* (2013.01); *H01L 33/62* (2013.01); *G09G 2310/0278* (2013.01)

(58) Field of Classification Search
CPC .................. G09G 3/32; G09G 3/3233; G09G 2300/0426; G09G 2300/0408; G09G 3/3648; G09G 3/3225; G09G 2330/04; G09G 2380/02; G09G 2300/026; H01L 27/3244; H01L 51/0097; H01L 51/56; H01L 23/4985; H01L 25/167; H01L 23/5387; G06F 1/1652; G06F 2203/04102; G06F 3/1446; G02F 1/13336
See application file for complete search history.

(56) References Cited

U.S. PATENT DOCUMENTS

| | | | |
|---|---|---|---|
| 2013/0234190 A1* | 9/2013 | Kim | H01L 33/52 257/98 |
| 2018/0315775 A1 | 11/2018 | He et al. | |
| 2018/0323180 A1* | 11/2018 | Cok | H01L 23/5386 |
| 2019/0035765 A1* | 1/2019 | Kim | B32B 7/12 |
| 2020/0321322 A1* | 10/2020 | Kim | H01L 25/0753 |

FOREIGN PATENT DOCUMENTS

| | | |
|---|---|---|
| CN | 102832230 A | 12/2012 |
| CN | 108470526 A | 8/2018 |
| TW | 201941416 A | 10/2019 |

* cited by examiner

*Primary Examiner* — Sanjiv D. Patel
(74) *Attorney, Agent, or Firm* — Tim Tingkang Xia, Esq.; Locke Lord LLP

(57) ABSTRACT

A light emitting diode (LED) display panel is provided. The LED display panel includes a printed circuit board (PCB), a flexible substrate disposed on the PCB, and a pixel array. The flexible substrate has a plurality of holes. The pixel array is formed by a first matrix circuit disposed on the flexible substrate, a second matrix circuit disposed on the PCB, and a plurality of LEDs disposed on the PCB, collectively defining a plurality of pixels. Each of the pixels comprises a corresponding one of the LEDs and pixel circuits formed by the first matrix circuit and the second matrix circuit. A projection of each of the LEDs correspondingly overlaps with a projection of one of the holes on the flexible substrate along an extending direction of the holes. A mosaic LED display panel may be formed by multiple LED display panel butted or tiled together.

19 Claims, 19 Drawing Sheets

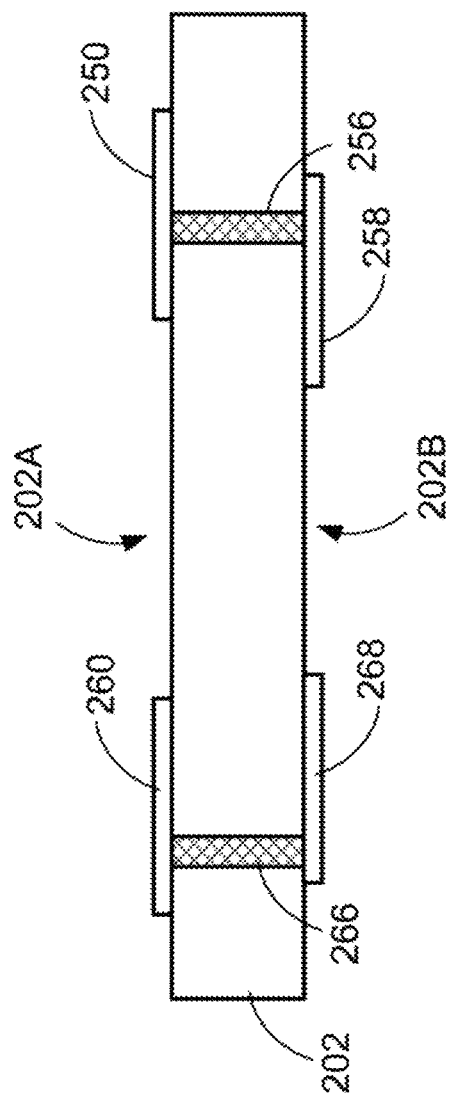

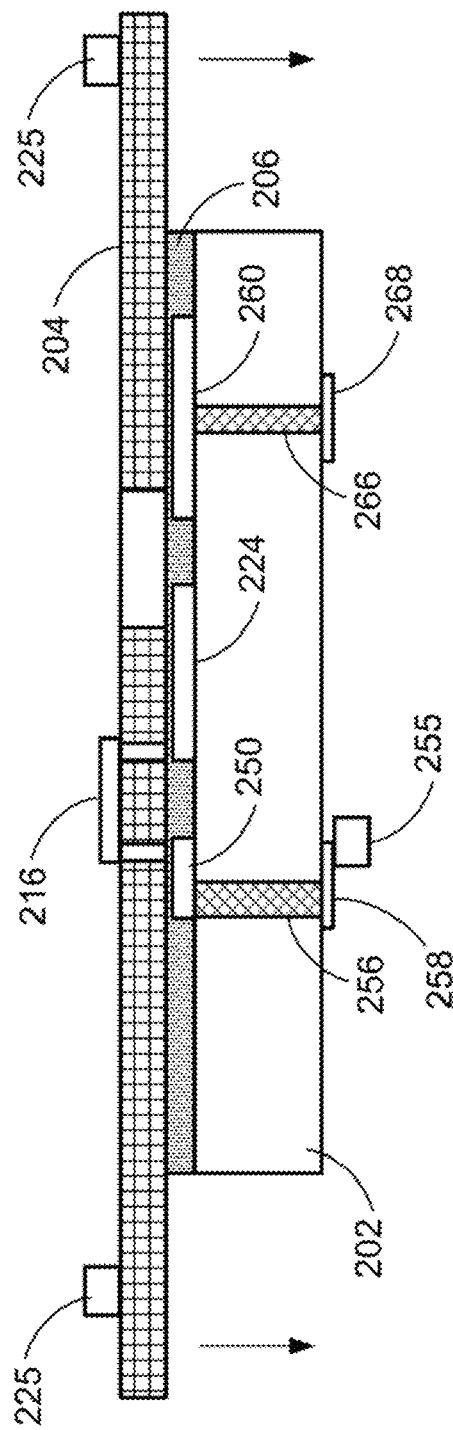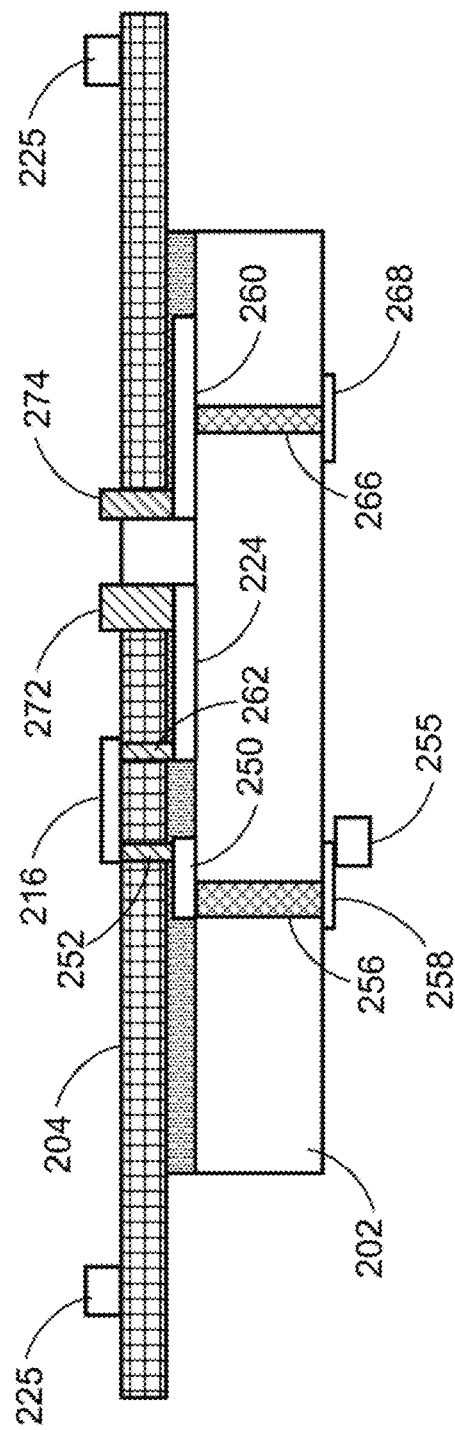
FIG. 7C
FIG. 7D

MOSAIC ACTIVE MATRIX DRIVEN LIGHT EMITTING DIODE (LED) DISPLAY PANEL

FIELD

The disclosure relates generally to display technology, and more particularly to a mosaic active matrix driven light emitting diode (LED) display panel.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In recent years, light emitting diode (LED) display panel has become a trend. Specifically, mini-LED or micro-LED display panels have the advantages of high brightness and large color gamut. Active matrix driven mini-LED or micro-LED display panels can increase the brightness and life of the display panels. However, the sizes of active matrix driven mini-LED or micro-LED display panels are limited due to limitations in ohmic drops (also known as IR drops) in the power lines and common lines and signal distortions of the scan and data signals. A mosaic structure can increase the sizes of mini-LED or micro-LED display panels. However, the resistance-capacitance (RC) loading of the power driving of an active matrix driven mini-LED or micro-LED display panel is a severe limitation on the size and efficiency of the display.

Therefore, a heretofore unaddressed need exists in the art to address the aforementioned deficiencies and inadequacies.

SUMMARY

One aspect of the disclosure relates to a light emitting diode (LED) display panel, which includes: a printed circuit board (PCB); a flexible substrate disposed on the PCB, wherein the flexible substrate has a plurality of holes; and a pixel array formed by a first matrix circuit disposed on the flexible substrate, a second matrix circuit disposed on the PCB, and a plurality of LEDs disposed on the PCB, collectively defining a plurality of pixels, wherein each of the pixels comprises a corresponding one of the LEDs and pixel circuits formed by the first matrix circuit and the second matrix circuit, and a projection of each of the LEDs correspondingly overlaps with a projection of one of the holes on the flexible substrate along an extending direction of the holes.

In certain embodiments, the first matrix circuit includes: a plurality of data lines extending along a first direction, configured to provide data signals to the pixels; and a plurality of scan lines extending along a second direction, configured to provide scan signals to the pixels.

In certain embodiments, the second matrix circuit includes: a plurality of power lines configured to provide power to the LEDs of the pixels; and a common electrode configured to be connected to a ground potential.

In certain embodiments, the pixel circuits of each of the pixels include: a scan transistor, having a control end electrically connected to a corresponding one of the scan lines, a first end electrically connected to a corresponding one of the data lines, and a second end; a driving transistor, having a control end electrically connected to the second end of the scan transistor, a first end electrically connected to a corresponding one of the power lines, and a second end; and a storage capacitor having a first electrode electrically connected to the second end of the scan transistor, and a second electrode electrically connected to the first end of the driving transistor, wherein the corresponding one of the LEDs of each of the pixels has one of two electrodes electrically connected to second end of the driving transistor, and the other of the two electrodes electrically connected to the common electrode to be connected to the ground potential.

In certain embodiments, for each of the pixels, the flexible substrate has a first through hole correspondingly located at a contact electrically connected to the first end of the driving transistor and a second through hole correspondingly located at a contact electrically connected to the second end of the driving transistor, a first conductive structure is formed in the first through hole to electrically connect the first end of the driving transistor to the corresponding one of the power lines, and a second conductive structure is formed in the second through hole to electrically connect the second end of the driving transistor to one of the two electrodes of the corresponding one of the LEDs.

In certain embodiments, for each of the pixels, a touch sensing mesh structure is disposed on the flexible substrate, and the touch sensing mesh structure, the first conductive structure and the second conductive structure are formed by a same conductive material.

In certain embodiments, the first conductive structure and the second conductive structure are formed by a plurality of solder bumps on the PCB.

In certain embodiments, the first conductive structure and the second conductive structure are formed by a plurality of conductive dots deposited in the first through hole and the second through hole.

In certain embodiments, the LED display panel further includes at least one scan driving circuit and at least one data driving circuit, wherein the scan lines are electrically connected to the at least one scan driving circuit, the data lines are electrically connected to the at least one data driving circuit, and the at least one scan driving circuit and the at least one data driving circuit are disposed in a border area of the flexible substrate.

In certain embodiments, at least one side of the border area of the flexible substrate is folded at an edge of the PCB.

In certain embodiments, the data lines and the scan lines of the first matrix circuit are disposed on a surface of the flexible substrate directly facing the PCB, and the power lines and the common electrode of the second matrix circuit are disposed on a surface of the PCB directly facing the flexible substrate.

In certain embodiments, the LED display panel further includes at least one scan driving circuit and at least one data driving circuit, wherein the at least one data driving circuit are disposed on a back surface of the PCB not facing the flexible substrate, and the PCB has a plurality of third through holes correspondingly located at each of the at least one data driving circuit, and a plurality of third conductive structures are formed in the third through holes to electrically connect the data lines to the at least one data driving circuit.

In certain embodiments, a thickness and a width of signal lines in the second matrix circuit are greater than a thickness and a width of signal lines in the first matrix circuit.

Another aspect of the disclosure relates to a mosaic LED display panel formed by a plurality of LED display modules butted together, wherein each of the LED display modules is the LED display panel as discussed above.

In certain embodiments, an integral PCB is configured to function as the PCB of each of the LED display modules, and the flexible substrates of the LED display modules are all bonded to the integral PCB.

In a further aspect of the disclosure, a method of forming a LED display panel includes: providing a flexible substrate, having a plurality of holes, a plurality of first through holes and a plurality of second through holes; forming a first matrix circuit on the flexible substrate; providing a printed circuit board (PCB); forming a second matrix circuit on the PCB; laminating the flexible substrate and the PCB together; forming, by a same conductive material, a plurality of first conductive structures in the first through holes, a plurality of second conductive structures in the second through holes, and a plurality of third and fourth conductive structures in the holes; and bonding a plurality of LEDs to the third and fourth conductive structures, wherein the first matrix circuit, the second matrix circuit and the LEDs collectively form a pixel array defining a plurality of pixels, and each of the pixels comprises a corresponding one of the LEDs and pixel circuits formed by the first matrix circuit and the second matrix circuit.

In certain embodiments, the first matrix circuit includes: at least one scan driving circuit and at least one data driving circuit disposed in a border area of the flexible substrate; a plurality of data lines extending along a first direction and electrically connected to the at least one data driving circuit, configured to provide data signals to the pixels; and a plurality of scan lines extending along a second direction and electrically connected to the at least one scan driving circuit, configured to provide scan signals to the pixels; and the second matrix circuit includes: a plurality of power lines configured to provide power to the LEDs of the pixels; and a common electrode configured to be connected to a ground potential.

In certain embodiments, the method further includes: folding at least one side of the border area of the flexible substrate at an edge of the PCB.

In certain embodiments, the pixel circuits of each of the pixels include: a scan transistor, having a control end electrically connected to a corresponding one of the scan lines, a first end electrically connected to a corresponding one of the data lines, and a second end; a driving transistor, having a control end electrically connected to the second end of the scan transistor, a first end electrically connected to a corresponding one of the power lines, and a second end; and a storage capacitor having a first electrode electrically connected to the second end of the scan transistor, and a second electrode electrically connected to the first end of the driving transistor, wherein the corresponding one of the LEDs of each of the pixels has one of two electrodes electrically connected to second end of the driving transistor, and the other of the two electrodes electrically connected to the common electrode to be connected to the ground potential; and wherein for each of the pixels, a corresponding one of the first through holes is correspondingly located at a contact electrically connected to the first end of the driving transistor, a corresponding one of the second through holes is correspondingly located at a contact electrically connected to the second end of the driving transistor, a corresponding one of the first conductive structures is formed in the corresponding one of the first through holes to electrically connect the first end of the driving transistor to the corresponding one of the power lines, and a corresponding one of the second conductive structures is formed in the corresponding one of the second through holes to electrically connect the second end of the driving transistor to the one of the two electrodes of the corresponding one of the LEDs.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein:

FIG. 2B schematically shows a PCB of the LED display panel as shown in FIG. 2A according to certain embodiments of the present disclosure.

FIGS. 7A to 7G show a method of forming the LED display panel as shown in FIG. 2A according to certain embodiments of the present disclosure.

DETAILED DESCRIPTION OF THE DISCLOSURE

Figure 1:
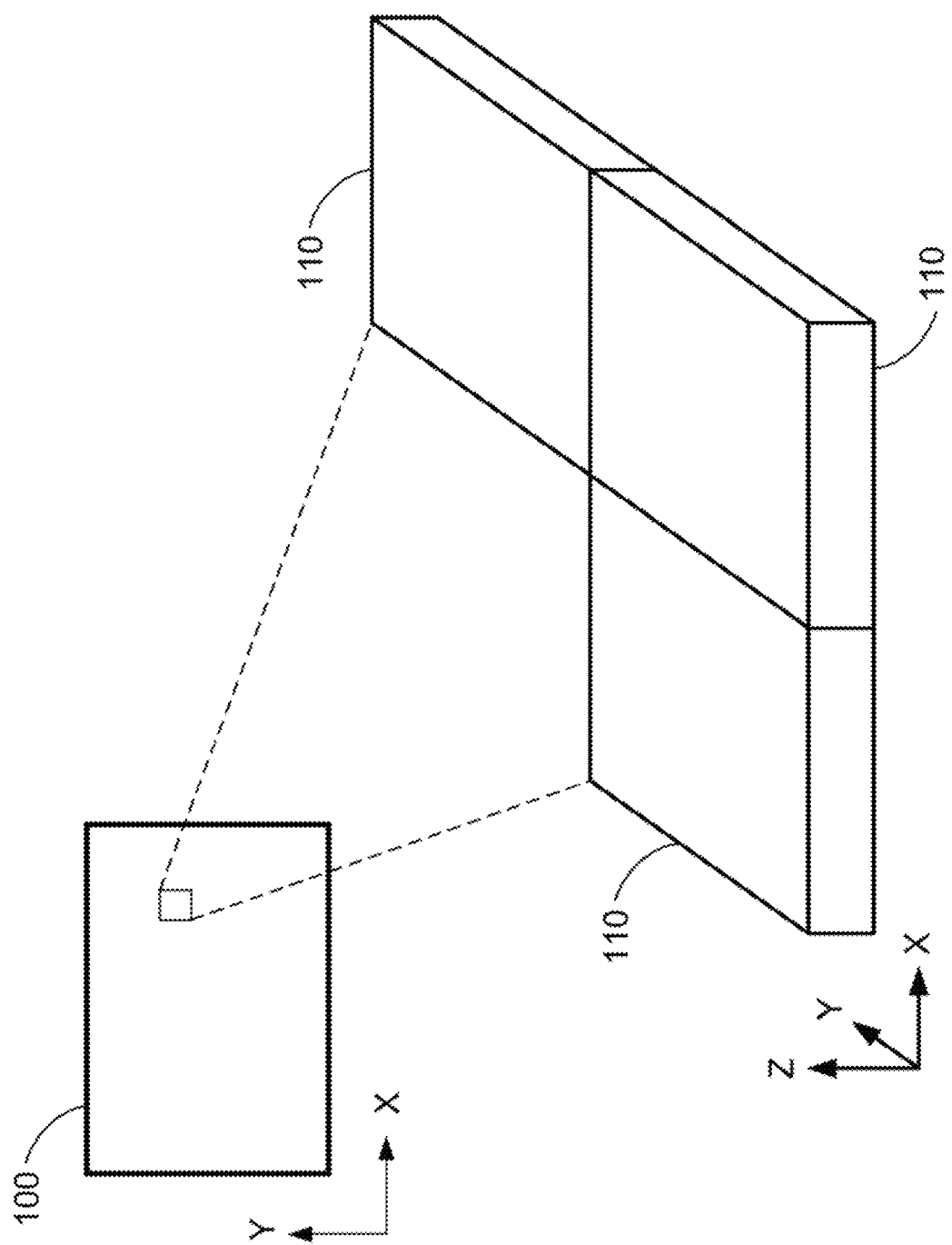
FIG. 1 schematically shows a mosaic LED display panel formed by multiple display modules according to certain embodiment of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a mosaic active matrix driven LED display panel.

In certain embodiments, the LED display panel as disclosed hereinafter includes multiple layers, and some of the layers in the LED display panel may be formed as one single layer or by the same material. Thus, some of the layers may be shown with patterns, and unless otherwise described, the layers shown with the same pattern may be formed in one single layer or may be formed by the same material.

One aspect of the disclosure relates to a LED display panel, which includes a PCB and a flexible substrate disposed on the PCB. The flexible substrate carries the active matrix scan and driving circuits, and the PCB carries the LEDs, the power lines and the ground lines. By combining the flexible substrate and the PCB, a LED display module may be formed with minimal border areas. In certain embodiments, multiple LED display modules can be butted or tiled together to form a large size LED display panel without disruption of the pitches of the display panel, and the addressing and driving of each display module can be individualized, enabling high frame rate addressing greater 120 Hz.

FIG. 1 schematically shows a mosaic LED display panel formed by multiple display modules according to certain embodiment of the present disclosure. As shown in FIG. 1, the mosaic LED display panel 100 includes multiple LED display modules 110 formed in a butted or tiled arrangement, and each LED display module 110 is a LED display panel. In each of the horizontal direction X and the vertical direction Y, there can be two or more LED display modules 110. Each LED display module 110 has a pixel array formed thereon, defining a plurality of pixels, and each of the pixels has a corresponding LED and pixel circuits, which will be described in detail later.

Figure 2A:
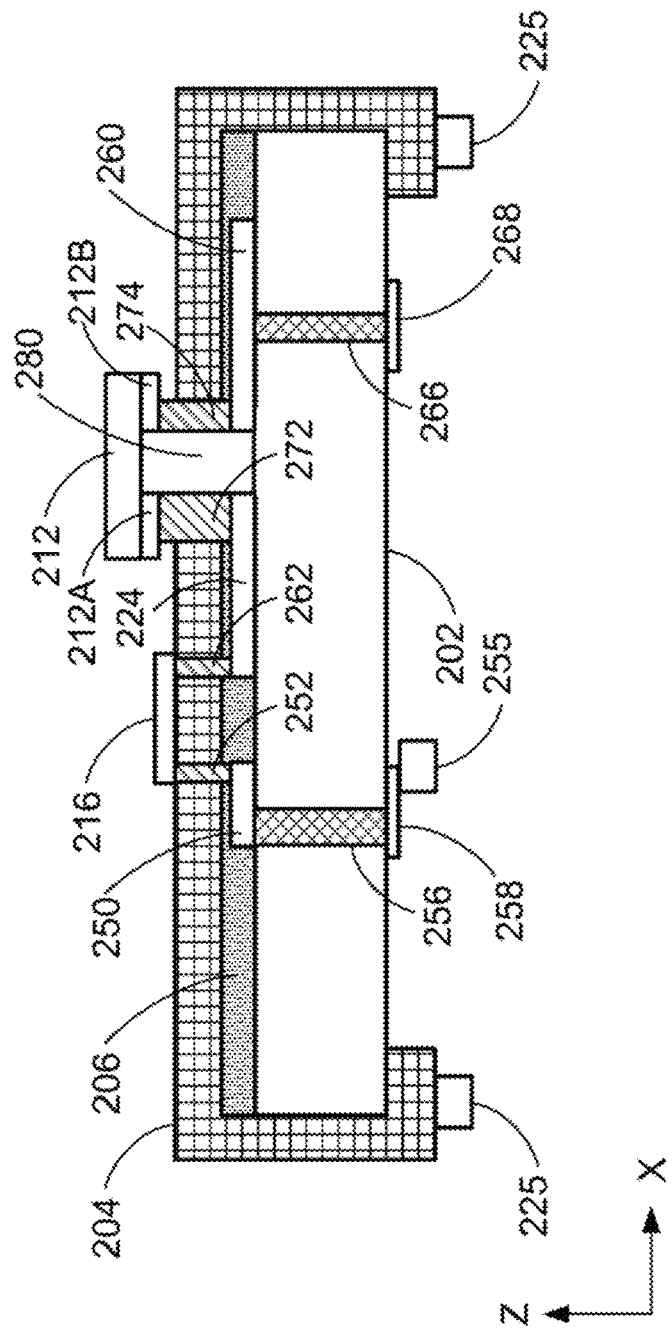
FIG. 2A schematically shows a LED display panel according to certain embodiments of the present disclosure.

FIG. 2A schematically shows a LED display panel according to certain embodiment of the present disclosure. Specifically, FIG. 2A shows a pixel of the LED display panel 200. As shown in FIG. 2A, the LED display panel 200 includes a PCB 202 and a flexible substrate 204 disposed on the top side of the PCB 202. An adhesive layer 206, such as a glue or other adhesive materials, is disposed between the PCB 202 and the flexible substrate 204 to bond the PCB 202 and the flexible substrate 204 together. In certain embodiments, the PCB 202, the flexible substrate 204 and the adhesive layer 206 are all respectively formed by insulating materials. For example, the flexible substrate 204 may be formed by flexible insulating materials such as polyimide (PI) or a flexible glass material. Specifically, the size of the flexible substrate 204 is larger than that of the PCB 202, allowing both sides of the border area of the flexible substrate 204 to be folded at the edges of the PCB 202 and attached to the bottom surface of the PCB 202. Further, a first matrix circuit is disposed on the flexible substrate 204, and a second matrix circuit is disposed on the PCB 202. The LED 212 is also disposed on the PCB 202. In certain embodiments, the LED 212 may be a micro-LED or a mini-LED. Specifically, the first matrix circuit may include a plurality of data lines and a plurality of scan lines (not shown in FIG. 2A), and the second matrix circuit may include a plurality of power lines 250 and a common electrode 260. Details of the first and second matrix circuits will be elaborated later.

In the pixel as shown in FIG. 2A, the first matrix circuit on the flexible substrate 204 has a thin film transistor (TFT) 216 disposed on the top surface of the flexible substrate 204. Although not shown in FIG. 2A, the data lines and the scan lines are also disposed on the top surface of the flexible substrate 204. Further, in addition to the power lines 250 and the common electrode 260, the second matrix circuit on the PCB 202 further includes a contact electrode 224. The power lines 250, the common electrode 260 and the contact electrode 224 are all disposed on the top surface of the PCB 202 facing the flexible substrate. Moreover, a plurality of data circuits 225 are disposed at the border area of the flexible substrate 204 folded onto the bottom side of the PCB 202 to be electrically connected to the data lines. In certain embodiments, each of the data circuits 225 may be formed by one or more data ICs. Although not shown in FIG. 2A, the border area of the flexible substrate 204 folded onto the bottom side of the PCB 202 may also be provided with a plurality of scan circuits (which may be formed by one or more scan ICs) to be electrically connected to the scan lines. The data ICs 225 and the scan ICs are provided as the data driving circuit and the scan driving circuit. Alternatively, in certain embodiments, the data circuits 225 and the scan circuits may be formed having a gate driver on array (GOA) design.

Further, as shown in FIG. 2A, each of the flexible substrates 204 and the PCB 202 has a plurality of through holes, allowing multiple conductive structures penetrating therethrough to electrically interconnect the first matrix circuit on the flexible substrate 204 and the second matrix circuit on the PCB 202. Specifically, the PCB 202 has two through holes, having a power conductive structure 256 and a grounding conductive structure 266 respectively formed therein. The power conductive structure 256 is used to electrically connect the power line 250 to a power contact 258 on the bottom surface of the PCB 202. Since the power contact 258 is electrically connected to a power circuit 255, the power line 250 may receive power from the power circuit 255 through the power contact 258 and the power conductive structure 256. In certain embodiments, the power circuit 255 may be formed by one or more power ICs. The grounding conductive structure 266 is used to electrically connect the common electrode 260 to a ground contact 268 on the bottom side of the PCB 202, such that the common electrode 260 is connected to a ground potential through the ground contact 268 and the grounding conductive structure 266. Similarly, the flexible substrate 204 has a through hole 280, allowing two conductive structures 272 and 274 to be formed in the through hole 280 to connect the two electrodes 212A and 212B of the LED 212 respectively to the contact electrode 224 and the common electrode 260 on the PCB 202. It should be noted that the space in the through hole 280 between the conductive structures 272 and 274 remains empty without being filled with any material. Further, in certain embodiments, the LED 212 is formed on the PCB 202 by the connection of the conductive structures 272 and 274 disposed in the through hole 280, and is thus not in direct contact with the flexible substrate 204. In this case, a projection of the LED 212 correspondingly overlaps with a projection of the through hole 280 along an extending direction Z of the through hole 280. The flexible substrate 204 further has two through holes with two conductive structures 252 and 262 respectively formed therein. The conductive structure 252 is used to electrically connect a first end of the TFT 216 to the power line 250, and the conductive structure 262 is used to electrically connect a second end of the TFT 216 to the contact electrode 224. In this case, the TFT 216 functions as a driving transistor for the pixel, allowing power to be provided from the power line 250 to one electrode 212A of the LED 212 through the conductive structure 252, the TFT 216, the conductive structure 262, the contact electrode 224, and the conductive structure 272. The other electrode 212B of the LED 212 is electrically connected to the common electrode 260, which is connected to a ground potential, through the conductive structure 274. In certain embodiments, each of the conductive structures 252, 262, 272 and 274 as well as the power conductive structure 256 and the grounding conductive structure 266 may be formed by a soldering material or other conductive materials.

In the LED display panel 200 as shown in FIG. 2A, the pixel array are separated into two portions, including the first matrix circuit on the top surface of the flexible substrate 202 and the second matrix circuit on the top surface of the PCB 204. The interconnection between the first matrix circuit and the second matrix circuit are implemented by the conductive structures. Further, by folding the border area of the flexible substrate 204 at the edges of the PCB 202 to be attached to the bottom surface of the PCB 202, all of the driving circuits (such as the data circuits 225 and the power circuit 255) are located at the bottom surface of the PCB 202, and a part of the first matrix circuit (such as the data lines and the scan lines) may extend on the outer surface of the flexible substrate 202 to connect with the corresponding driving circuits. Thus, the size of the border area of the LED display panel 200 is reduced, and multiple LED display panels 200 with the same configuration may be butted or tiled together to form a large sized LED display panel in the way as shown in FIG. 1.

In the embodiment as shown in FIG. 2A, the border area of the flexible substrate 204 at both sides are folded at the edges of the PCB 202 and attached to the bottom surface of the PCB 202. In other embodiments, it is possible that only one side of the border area of the flexible substrate 204 is folded at the corresponding edge of the PCB 202 and attached to the bottom surface of the PCB 202, while the other side of the border area of the flexible substrate 204 is not folded.

Figure 2C:
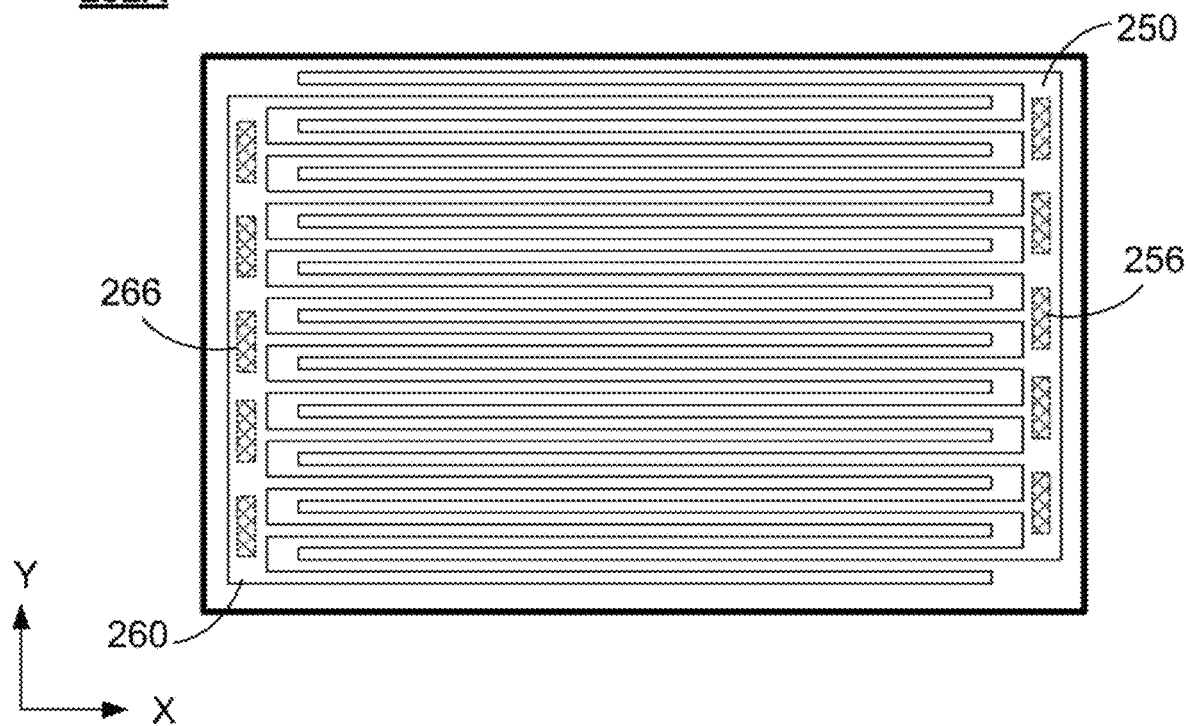
FIG. 2C shows a top view of the PCB as shown in 2B according to one embodiment of the present disclosure.
Figure 2D:
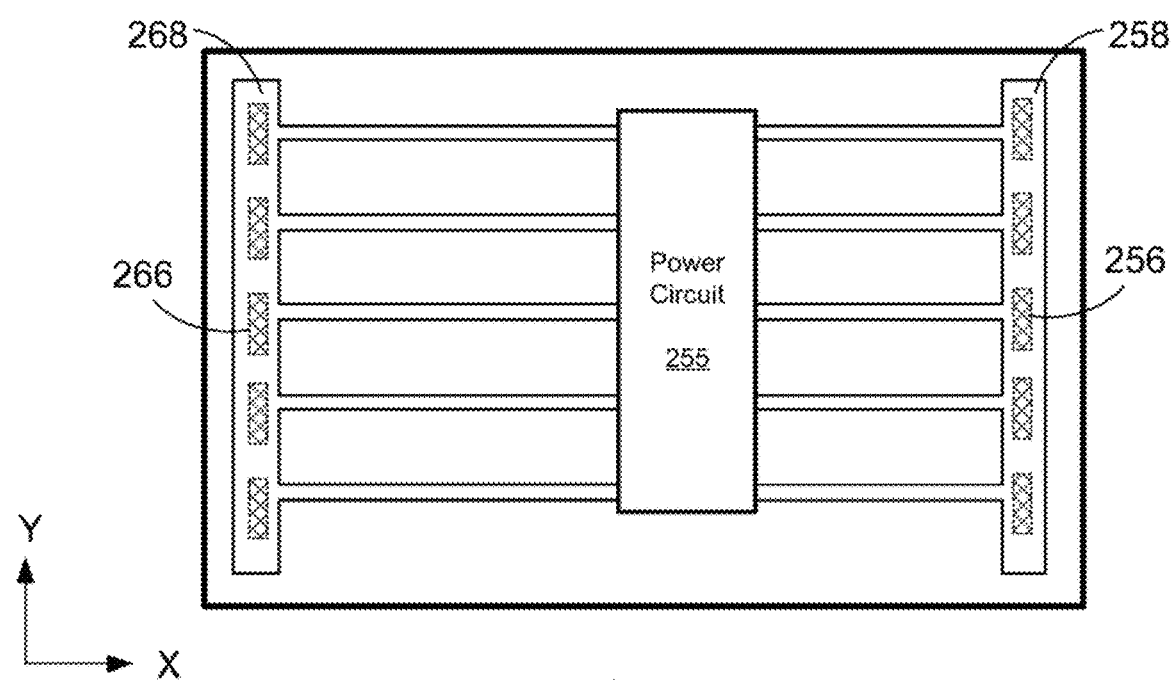
FIG. 2D shows a bottom view of the PCB as shown in 2B according to one embodiment of the present disclosure.

FIG. 2B schematically shows a PCB of the LED display panel as shown in FIG. 2A according to certain embodiment of the present disclosure, and FIGS. 2C and 2D respectively show the top and bottom views of the PCB as shown in 2B. Specifically, as shown in FIG. 2B, the power lines 250 and the common electrode 260 are formed on the top surface 202A of the PCB 202, and the power contacts 258 and the ground contacts 268 are formed on the bottom surface 202B of the PCB 202. As shown in FIG. 2C, the power lines 250 and the common electrode 260 on the top surface 202A of the PCB 202 may be in the form of a plurality of branches extending in the horizontal direction X to correspond to all pixels in the pixel array. As shown in FIG. 2D, the power contacts 258 and the ground contacts 268 on the bottom surface 202B of the PCB 202 may also include branch structures. In certain embodiments, the power lines 250 and the common electrode 260 as shown in FIG. 2C as well as the power contacts 258 and the ground contacts 268 may be formed in different shapes and/or arrangements. For example, the branches of the power lines 250 and the common electrode 260 as shown in FIG. 2C and the branches of the power contacts 258 and the ground contacts 268 may be arranged to extend along the vertical direction Y. Further, as shown in FIG. 2D, all of the power contacts 258 and the ground contacts 268 are electrically connected to a single power circuit 255, which may be formed by one or more power ICs. For example, the power circuit 255 may be formed by two power ICs respectively providing Vdd/Vss to the power contacts 258 and the ground contacts 268. In certain embodiments, multiple power circuits 255 may be provided and respectively connected to the power contacts 258 and the ground contacts 268 separately.

Figure 2E:
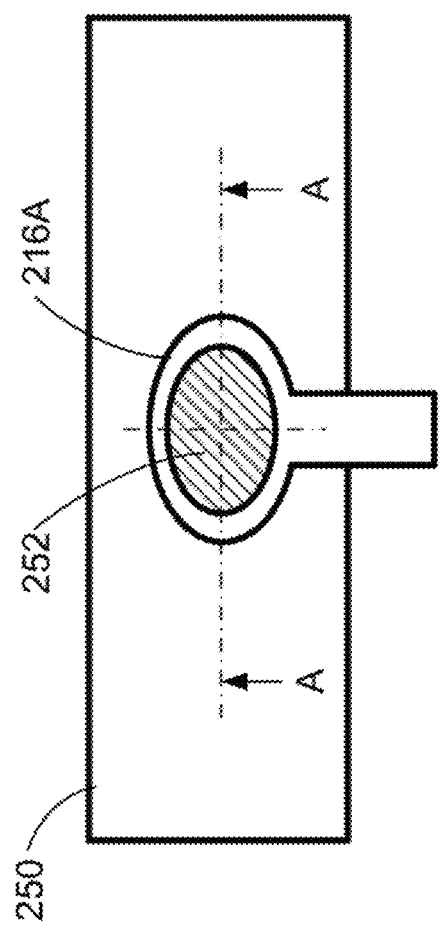
FIG. 2E shows a top view of the electronic connection structure of the power line as shown in FIG. 2A according to one embodiment of the present disclosure.
Figure 2F:
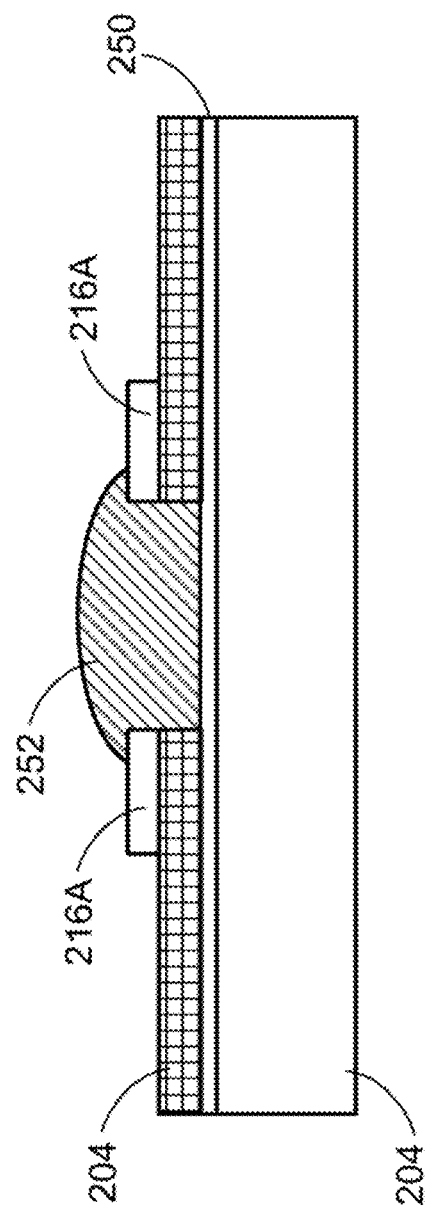
FIG. 2F shows a cross-sectional view of FIG. 2E along line A-A.
Figure 2G:
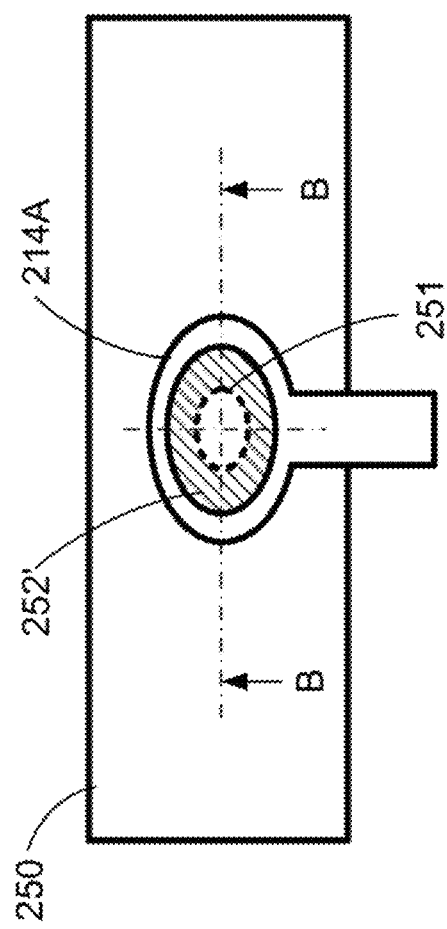
FIG. 2G shows a top view of the electronic connection structure of the power line as shown in FIG. 2A according to another embodiment of the present disclosure.
Figure 2H:
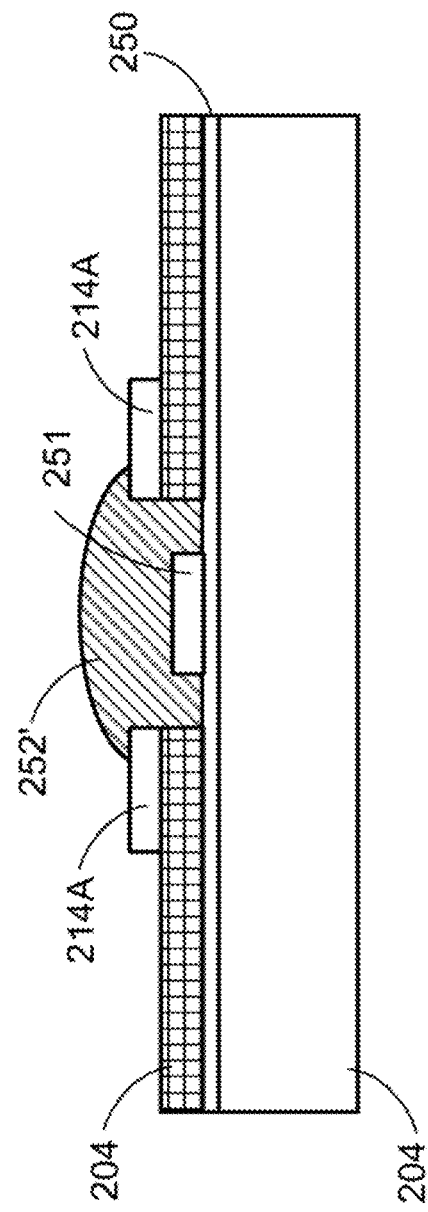
FIG. 2H shows a cross-sectional view of FIG. 2G along line B-B.

As discussed above, each of the conductive structures 252, 262, 272 and 274 as well as the power conductive structure 256 and the grounding conductive structure 266 may be formed by a soldering material or other conductive materials. In one embodiment, the conductive structures may be formed by solder bumps or conductive dots. For example, FIGS. 2E and 2F shows the electronic connection structure of the power line as shown in FIG. 2A according to one embodiment of the present disclosure, where the electronic connection structure of the power line 250 is used as an exemplary embodiment for all of the conductive structures. As shown in FIGS. 2E and 2F, the conductive structure 252 is formed by a solder bump, which is disposed in and protrudes from the corresponding through hole of the flexible substrate 204. With a heating process, the solder bump melts and reflows, thus electrically connecting the power line 250 on the PCB to the TFT electrode 216A, which functions as a contact electrically connected to the first end of the TFT 216. FIGS. 2G and 2H shows the electronic connection structure of the power line as shown in FIG. 2A according to another embodiment of the present disclosure, which shows the same electronic connection of the power line 250 as shown in FIGS. 2E and 2F with a different structure. As shown in FIGS. 2G and 2H, the power line has an electrode 251 located corresponding to the through hole of the flexible substrate 204, and the conductive structure 252' is formed by disposing a conductive dot in the corresponding through hole of the flexible substrate 204. In certain embodiments, the conductive dot may be disposed by screen printing. Once the conductive dot is disposed, a heating process may be performed to melt the conductive dot to form the conductive structure 252', thus electrically connecting the power line 250 on the PCB to the TFT electrode 216A at the first end of the TFT 216.

Figure 3A:
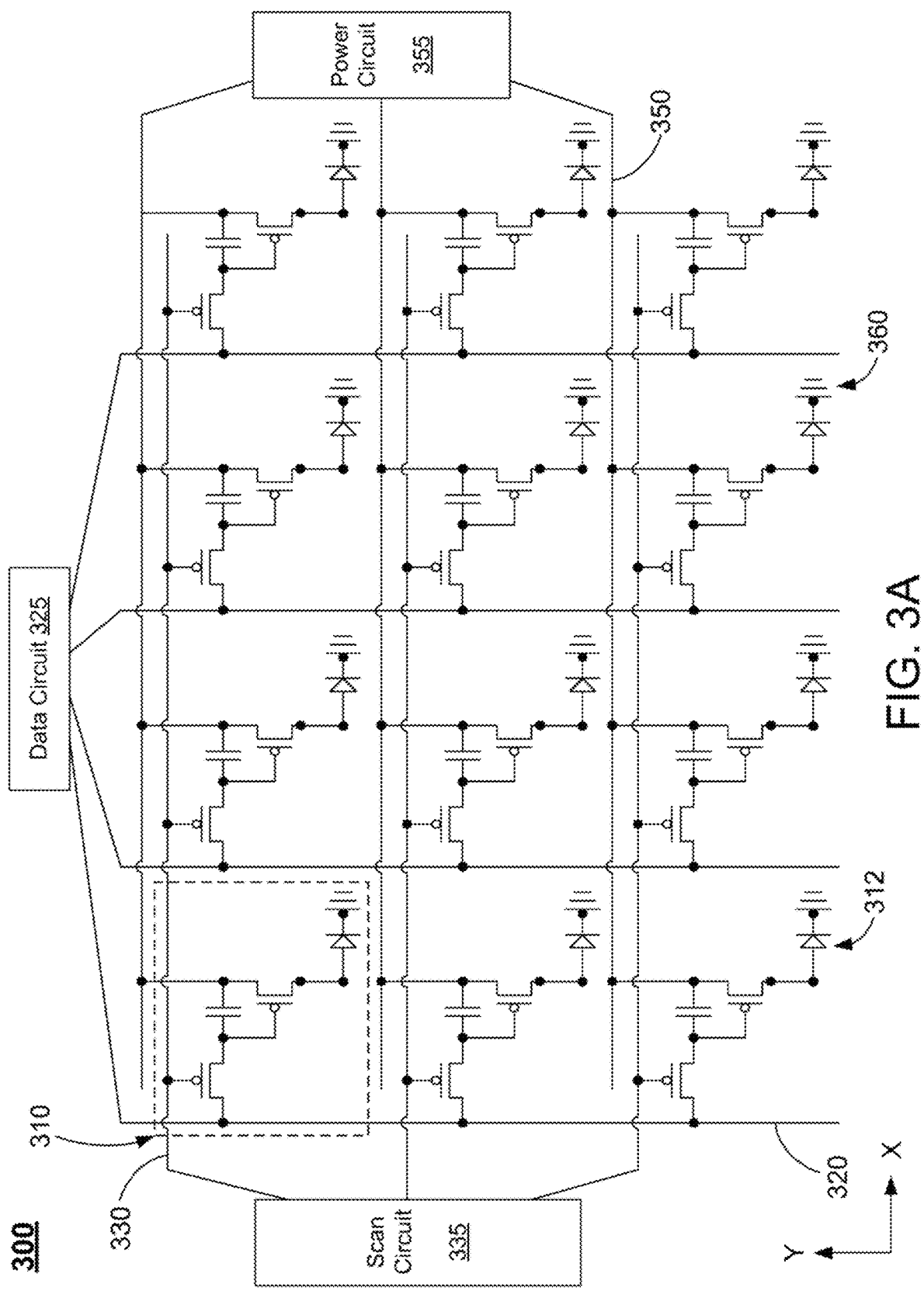
FIG. 3A schematically shows an active matrix circuitry of the LED display panel as shown in FIG. 2A according to one embodiment of the present disclosure.
Figure 3B:
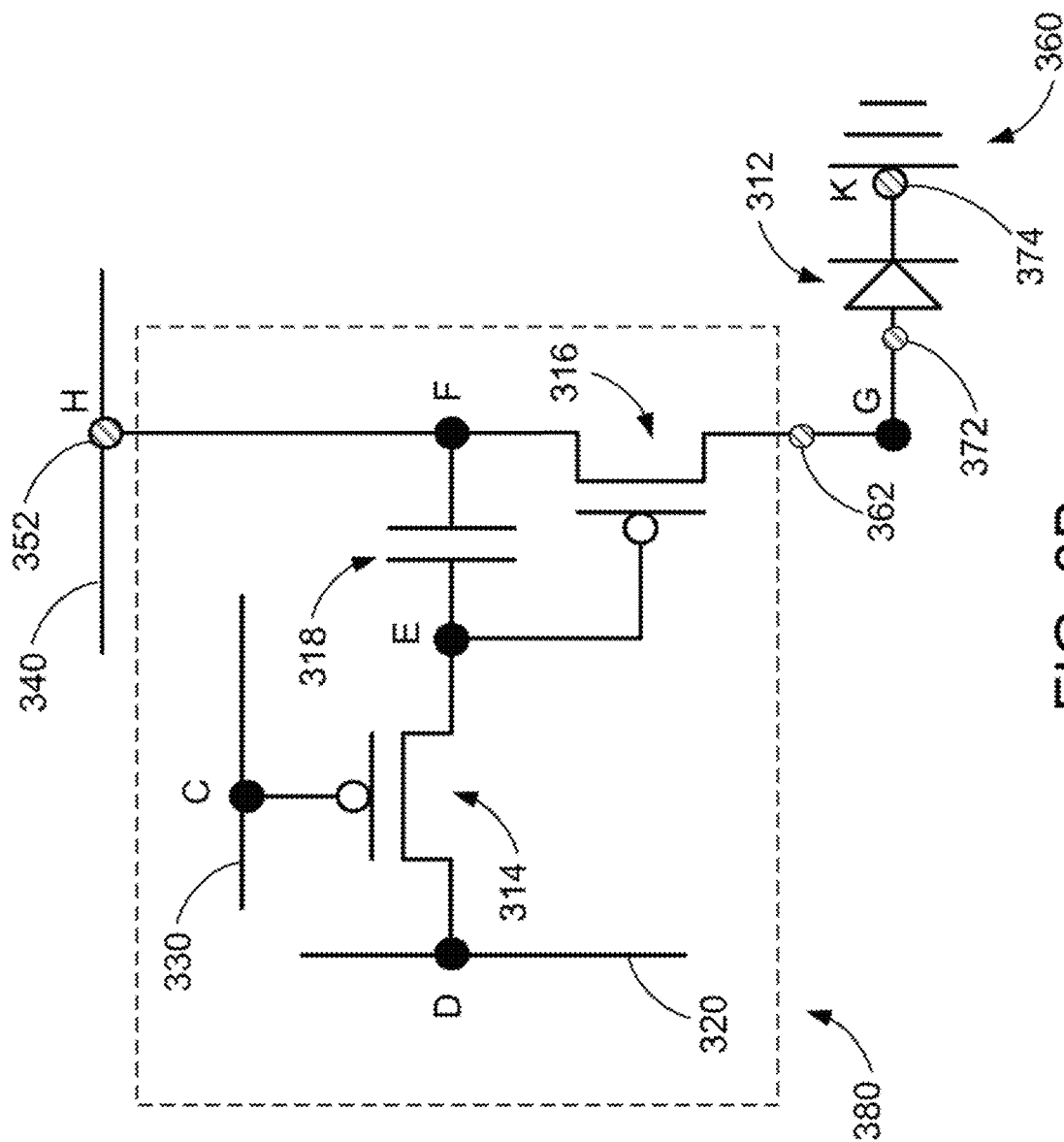
FIG. 3B schematically shows pixel circuits of a pixel as shown in FIG. 3A.

In the embodiments as described above, the pixel array is collectively formed by the first matrix circuit on the flexible substrate 204 and the second matrix circuit on the PCB 202. FIGS. 3A and 3B schematically shows an active matrix circuitry of the LED display panel as shown in FIG. 2A according to one embodiment of the present disclosure. As shown in FIG. 3A, the pixel array 300 includes a plurality of pixels 310, a plurality of data lines 320 extending along the vertical direction Y, and a plurality of scan lines 330 and a plurality of power lines 350 extending along the horizontal direction X. Further, a common electrode 360 is provided to be connected to a ground potential. The data lines 320 are all connected to a data circuit 325 (which may be a data IC or GOA) to provide data signals generated by the data circuit 325 to the pixels 310. The scan lines 330 are all connected to a scan circuit 335 (which may be a scan IC or GOA) to provide scan signals generated by the scan circuit 335 to the pixels 310. The power lines 350 are all connected to a power circuit 355 (which may be a power IC or GOA) to provide power transmitted by the power circuit 355 to provide power to the LEDs 312 of the pixels 310. Although FIG. 3A shows only one data circuit 325, only one scan circuit 335 and only one power circuit 355, in certain embodiments, multiple data circuits 325, multiple scan circuits 335 and/or multiple power circuits 355 may be provided.

As shown in FIG. 3B, the pixel circuits of each pixel 310 include a corresponding LED 312, a scan transistor 314, a driving transistor 316 and a storage capacitor 318. The LED 312 has two electrodes, where one electrode is electrically connected to a node G, and the other electrode is electrically connected to the common electrode 360 to be connected to the ground potential. The scan transistor 314 has a control end electrically connected to a node C, which is on a corresponding scan line 330; a first end electrically connected to a node D, which is on a corresponding data line 320; and a second end electrically connected to a node E. The driving transistor 316 has a control end electrically connected to the second end of the scan transistor 314 through the node E; a first end electrically connected to a node F, which is electrically connected to a node H on a corresponding power line 340; and a second end electrically connected to one electrode of the LED 312 through node G. The storage capacitor 318 has a first electrode electrically connected to the second end of the scan transistor 314 through the node E, and a second electrode electrically connected to the first end of the driving transistor 316 through the node F.

Comparing FIGS. 3A and 3B to FIG. 2A, it should be noted that the power line 250 as shown in FIG. 2A corresponds to each power line 350 as shown in FIG. 3A, the common electrode 260 as shown in FIG. 2A corresponds to the common electrode 360 as shown in FIG. 3A, and the TFT 216 as shown in FIG. 2A corresponds to the driving transistor 316 as shown in FIG. 3B. Thus, as shown all of the pixel circuits, including the scan transistor 314, the driving transistor 316 and the storage capacitor 318, as well as the data lines 320 and the scan lines 330, collectively form the first matrix circuit 380 (enclosed in the dotted box in FIG. 3B) on the flexible substrate 204. Meanwhile, the LEDs 312, the power lines 350 and the common electrode 360 collectively form the second matrix circuit (outside the dotted box in FIG. 3B) on the PCB 202. To electrically connect the components of the first matrix circuit and the second matrix circuit, as shown in FIG. 3B, a conductive structure 352, which is located at the node H as shown in FIG. 3B and corresponds to the conductive structure 252 as shown in FIG. 2A, is provided to electrically connect the first end of the driving transistor 316 to the power line 350. A conductive structure 362, which is located near the node G as shown in FIG. 3B and corresponds to the conductive structure 262 as shown in FIG. 2A, is provided to electrically connect the second end of the driving transistor 316 to the node G, which corresponds to the contact electrode 224 as shown in FIG. 2A. A conductive structure 372, which is located near the node G as shown in FIG. 3B and corresponds to the conductive structure 272 as shown in FIG. 2A, is provided to electrically connect the node G, which corresponds to the contact electrode 224 as shown in FIG. 2A, to one electrode of the LED 312. A conductive structure 374, which is located at the node K as shown in FIG. 3B and corresponds to the conductive structure 274 as shown in FIG. 2A, is provided to electrically connect the other electrode of the LED 312 to the common electrode 360.

Figure 3C:
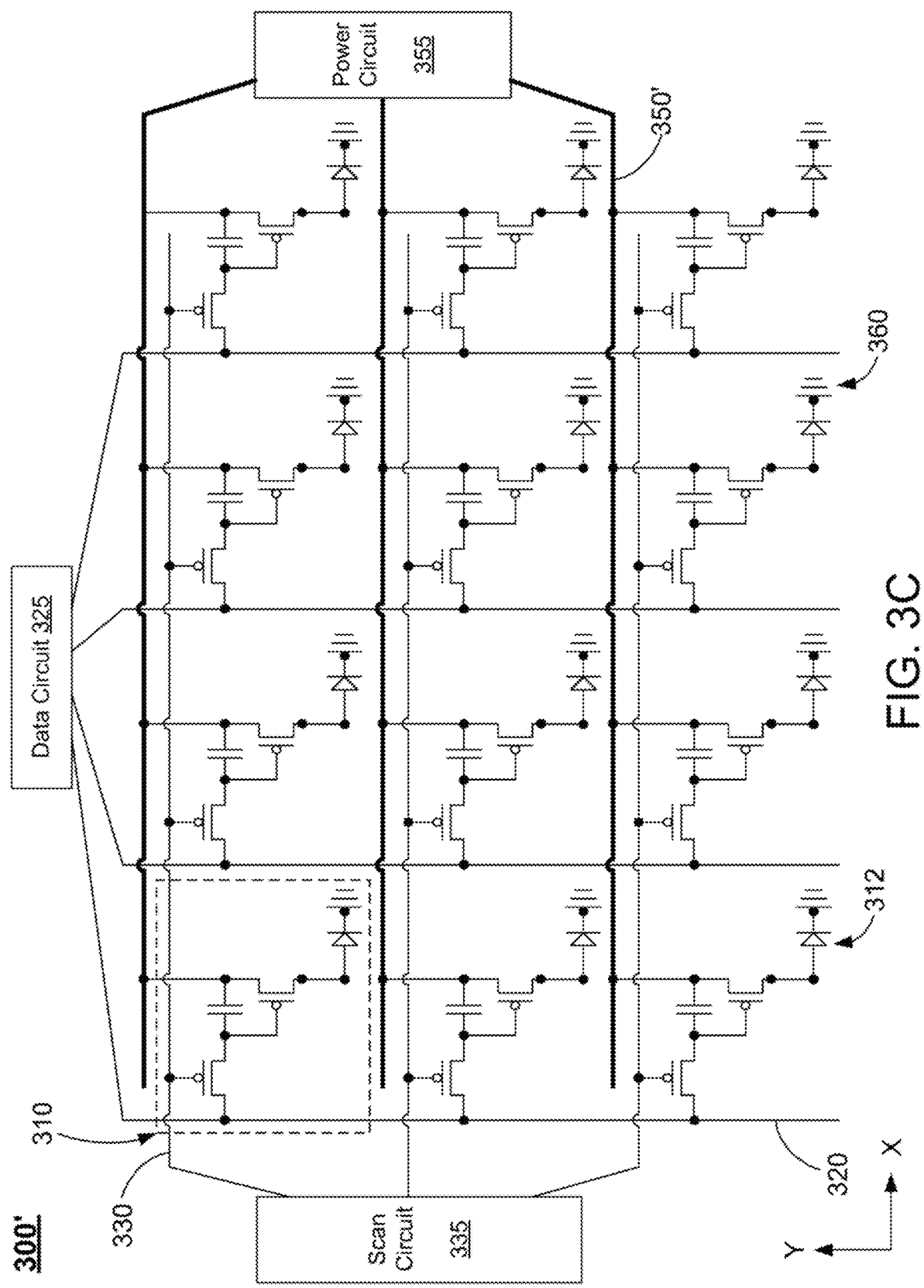
FIG. 3C schematically shows an active matrix circuitry of the LED display panel as shown in FIG. 2A according to another embodiment of the present disclosure.

It should be noted that the active matrix circuitry as shown in FIGS. 3A and 3B may be further modified. For example, FIG. 3C schematically shows an active matrix circuitry of the LED display panel as shown in FIG. 2A according to another embodiment of the present disclosure. Specifically, the only difference between the pixel array 300' as shown in FIG. 3C and the pixel array 300 as shown in FIG. 3A exists in the power lines 350', which are shown in bold lines in FIG. 3C, to indicate the thickness and/or the width of the power lines 350' being greater than the thickness and/or the width of other signal lines (e.g., the data lines 320 and the scan lines 330).

Figure 4:
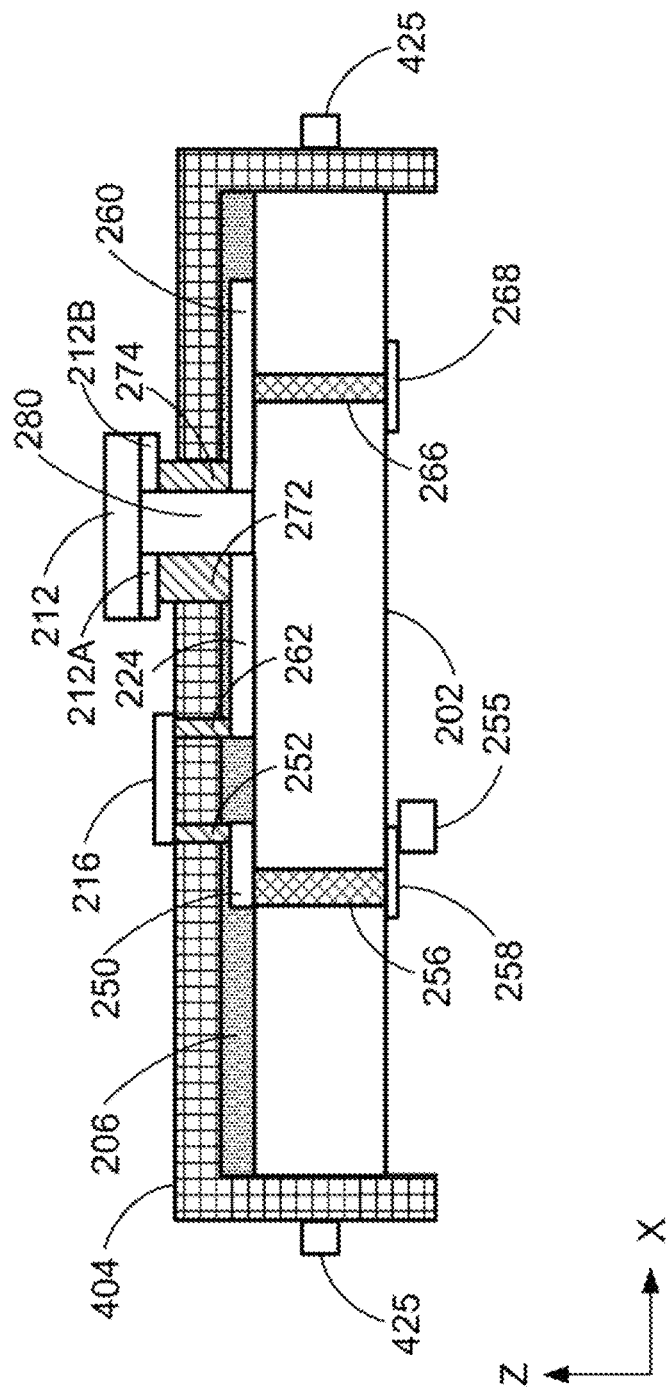
FIG. 4 schematically shows a LED display panel according to another embodiment of the present disclosure.

In the embodiment as shown in FIG. 2A, the size of the flexible substrate 204 is larger than that of the PCB 202, allowing the border area of the flexible substrate 204 to be folded at the edges of the PCB 202 and attached to the bottom side of the PCB 202. In other embodiments, the border area of the flexible substrate 204 may be formed differently. For example, FIG. 4 schematically shows a LED display panel according to another embodiment of the present disclosure. Specifically, the only difference between the LED display panel 400 as shown in FIG. 4 and the LED display panel 200 as shown in FIG. 2A exists in the flexible substrate. As shown in FIG. 4, the flexible substrate 404 is also larger than the PCB 202, such that the border area of the flexible substrate 404 is folded at the edges of the PCB 202. However, the folded border area of the flexible substrate 404 are attached to the side edges of the PCB 202, and the data ICs 425 are formed at the border area of the flexible substrate 404 attached to the side edges of the PCB 202. Other components of the LED display panel 400 as shown in FIG. 4 are identical or similar to those of the LED display panel 200 as shown in FIG. 2A, and are not further elaborated hereinafter.

Figure 5A:
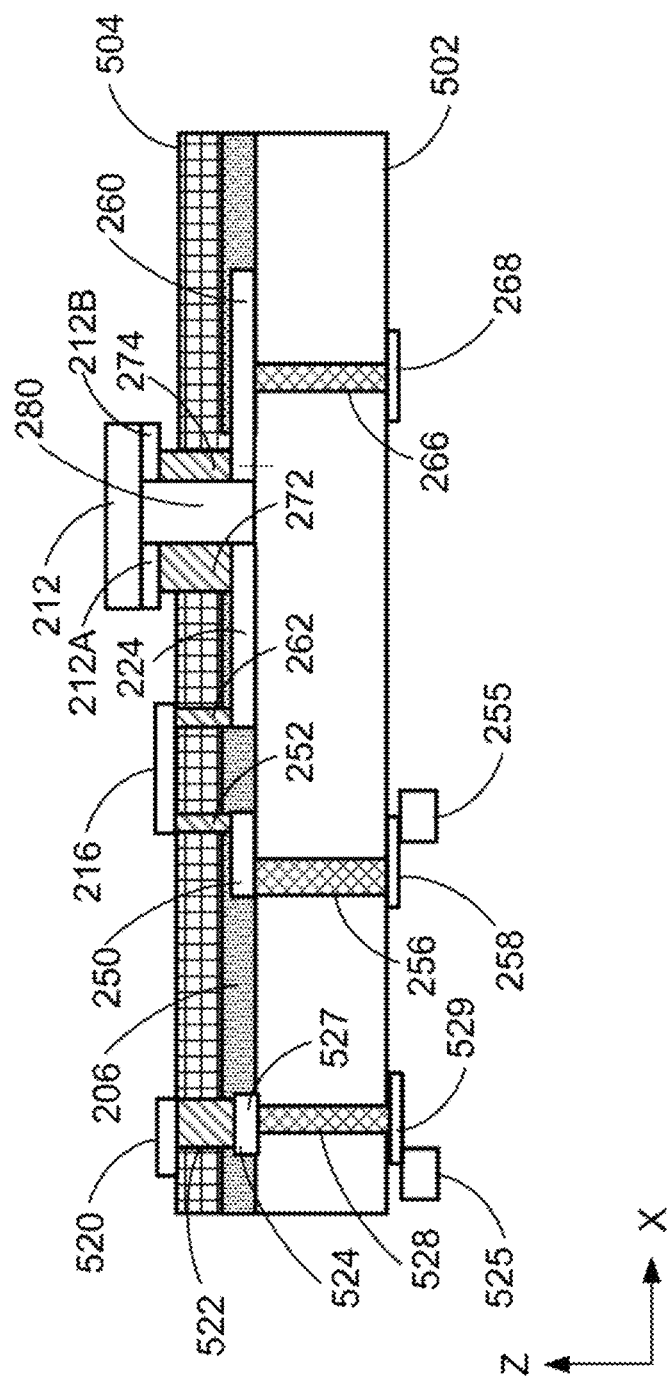
FIG. 5A schematically shows a LED display panel according to yet another embodiment of the present disclosure.

FIG. 5A schematically shows a LED display panel according to yet another embodiment of the present disclosure. Specifically, the differences between the LED display panel 500 as shown in FIG. 5A and the LED display panel 200 as shown in FIG. 2A exist in the flexible substrate and the PCB, where additional through holes and corresponding conductive structures are provided, and a portion of the first matrix circuit related to the data lines and the scan lines. As shown in FIG. 5A, the flexible substrate 504 and the PCB 502 have substantially the same size, and there is no need to fold the border area of the flexible substrate 504. Further, the data line 520 on the top surface of the flexible substrate 504 is electrically connected to the data IC 525 sequentially through a conductive structure 522 penetrating through the flexible substrate 504, a top data contact 527 on the top surface of the PCB 502, a conductive structure 528 penetrating through the PCB 502, a bottom data contact 529 on the bottom surface of the PCB 502. In other words, for each pixel of the LED display panel 500, each of the PCB 502 and the flexible substrate 504 is further provided with an additional through hole for the conductive structures 522 and 528, allowing the connections of the data lines 520 with the data IC 525 to pass therethrough. Although not illustrated in FIG. 5A, the scan line and the scan IC may be provided with additional conductive structures similarly to the arrangement of the data line 520 and the data IC 525. Thus, the border area of the LED display panel 200 may be further reduced and eliminated, and multiple LED display panels 200 with the same configuration may be butted or tiled together to form a large sized LED display panel in the way as shown in FIG. 1. Other components of the LED display panel 500 as shown in FIG. 5A are identical or similar to those of the LED display panel 200 as shown in FIG. 2A, and are not further elaborated hereinafter.

Figure 5B:
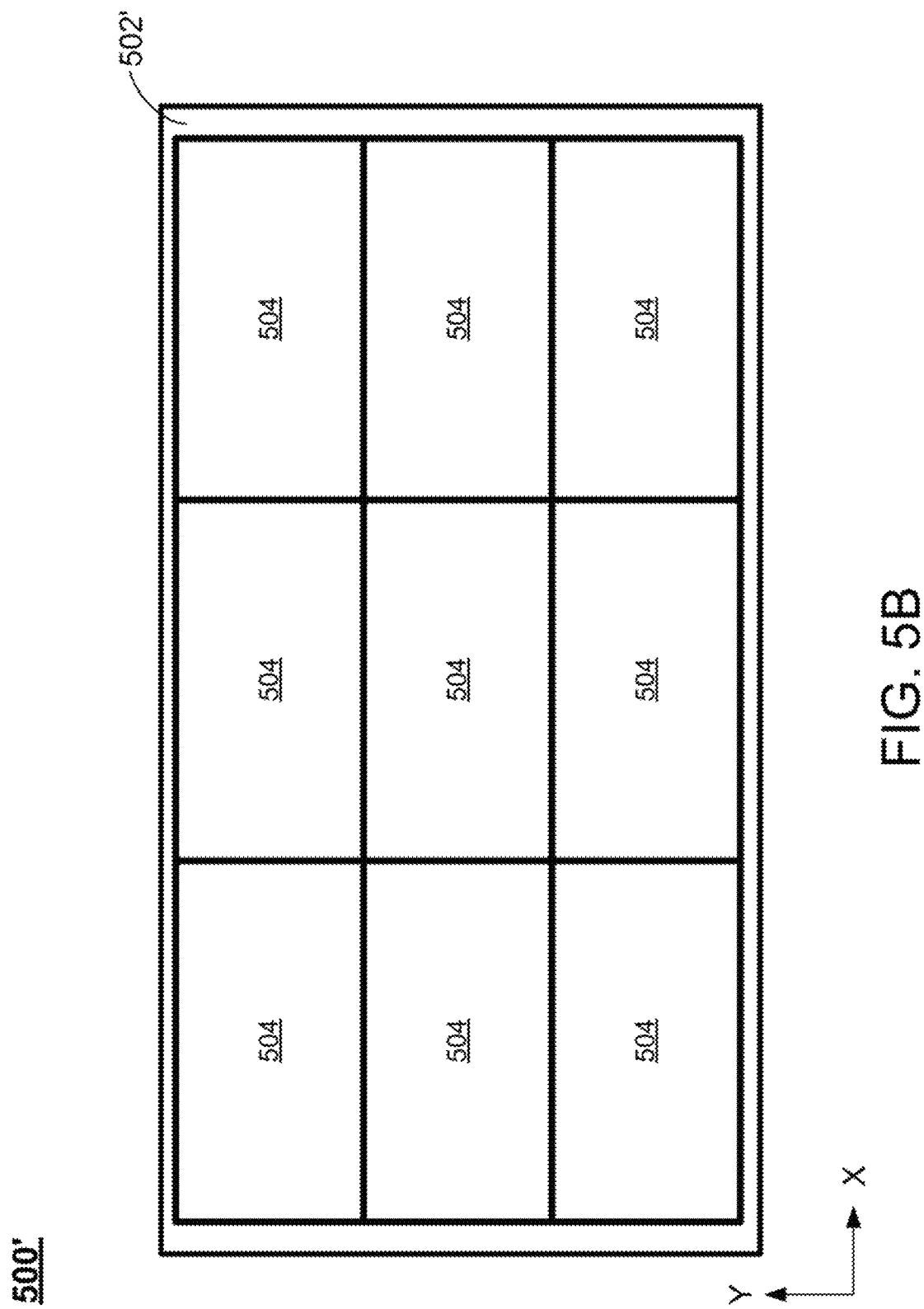
FIG. 5B schematically shows a mosaic LED display panel formed by multiple LED display panels according to certain embodiments of the present disclosure.
Figure 5C:
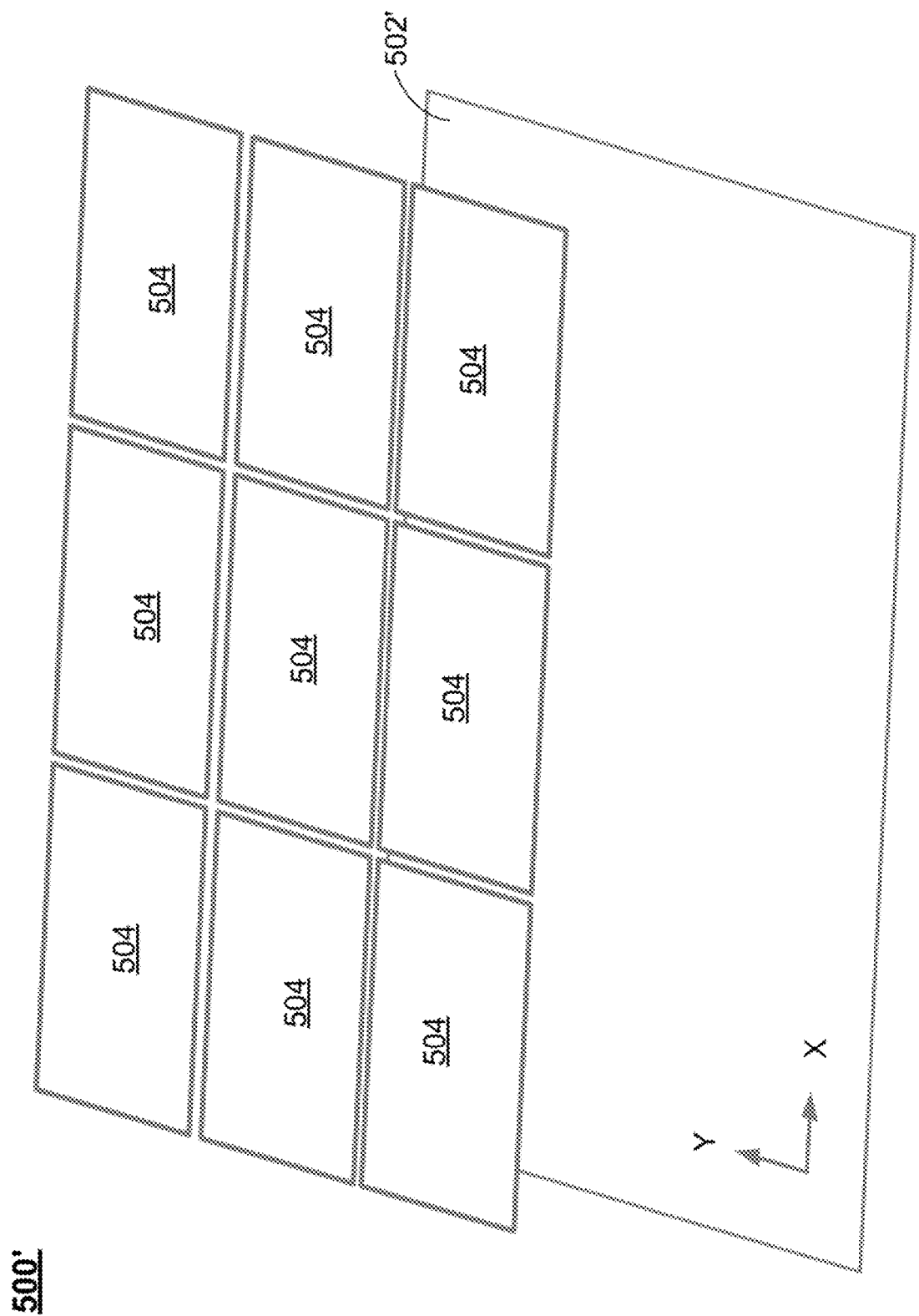
FIG. 5C schematically shows an exploded perspective view of the mosaic LED display panel as shown in FIG. 5B.

FIGS. 5B and 5C schematically shows a mosaic LED display panel formed by multiple LED display panels according to certain embodiments of the present disclosure. Specifically, as shown in FIGS. 5B and 5C, the LED display panel 500' is formed by a large integral PCB 502' and a plurality of flexible substrates 504 butted or tiled together, where the detailed structures of each flexible substrate 504 and the large integral PCB 502' are similar to those of the LED display panel 500 as shown in FIG. 5A. By providing a large integral PCB 502' instead of multiple PCBs, no alignment for the PCBs is required. In certain embodiments, the addressing and driving of each of the display modules formed by the flexible substrates 504 may be individualized, enabling high frame rate addressing of greater than 120 Hz. Since the border areas of each flexible substrate 504 is greatly reduced or eliminated, the display modules formed by the flexible substrates 504 may be arranged side by side and aligned with each other, thus maintaining the pitches of the pixels with minimal disruption.

In the embodiments as discussed above, the first matrix circuit on the flexible substrate are all disposed on the top surface of the flexible substrate, and there is a need to provide the through holes and the corresponding conductive structures in the flexible substrate to electrically connect the first matrix circuit to the second matrix circuit on the PCB. For example, in the LED display panel 200 as shown in FIG. 2A, the TFT 214 is formed on the top surface of the flexible substrate 204, such that the conductive structures 252 and 262 are required to electrically connect the TFT 214 to the power line 250 and the contact electrode 224. In other embodiments, the first matrix circuit on the flexible substrate may be disposed on the bottom surface of the flexible substrate to directly face the PCB. In this case, the components of the first matrix circuit may be electrically connect to the second matrix on the PCB without providing the through holes and the corresponding conductive structures in the flexible structure.

Figure 6:
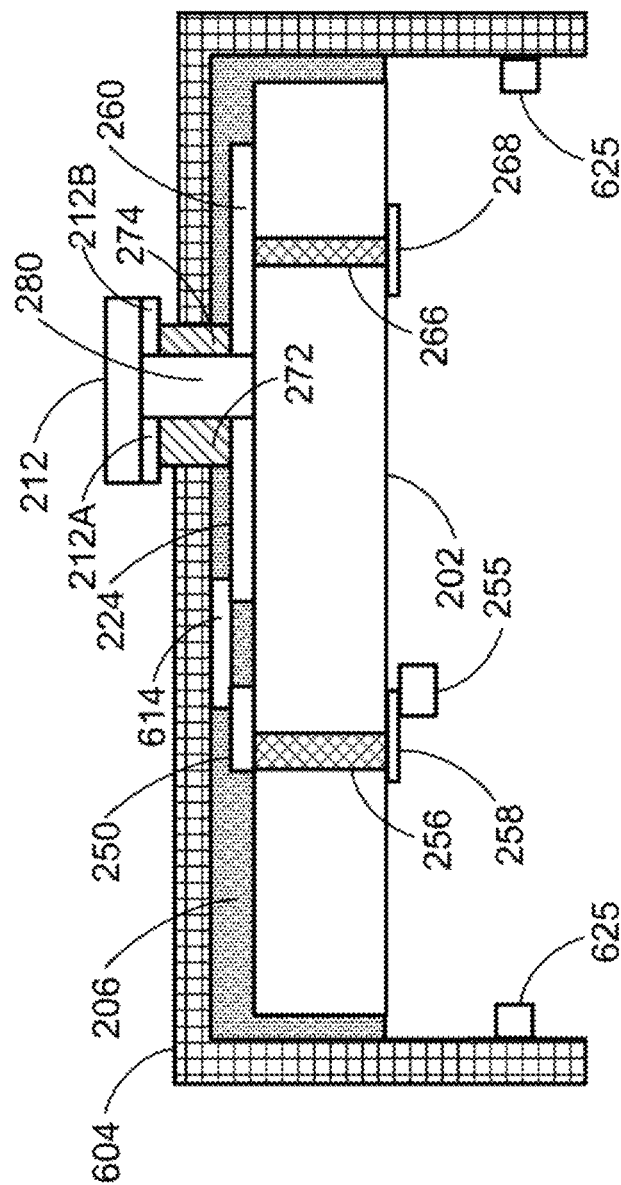
FIG. 6 schematically shows a LED display panel according to a further embodiment of the present disclosure.

For example, FIG. 6 schematically shows a LED display panel according to a further embodiment of the present disclosure. Specifically, the differences between the LED display panel 600 as shown in FIG. 6 and the LED display panel 200 as shown in FIG. 2A exist in the flexible substrate and the first matrix circuit on the flexible substrate. As shown in FIG. 6, the flexible substrate 604 is also larger than the PCB 202, such that the border area of the flexible substrate 404 is folded at the edges of the PCB 202. However, the folded border area of the flexible substrate 604 are attached to the side edges of the PCB 202 and extend further downward. Further, the TFT 614 is disposed on the bottom surface of the flexible substrate 604 to directly face the PCB 202. Since the second matrix circuit on the PCB 202, including the power line 250, the contact electrode 224 and the common electrode 260, are all formed on the top surface of the PCB 202 directly facing the flexible substrate 604, the TFT 614 may be electrically connected to the power line 250 and the contact electrode 224 without providing additional conductive structures. Similarly, although not shown in FIG. 6, the data lines and the scan lines are also disposed on the bottom surface of the flexible substrate 604 to directly face the PCB 202. In this case, the data ICs 625 and the scan ICs (not shown) may also be formed at the inner side of the border area of the flexible substrate 604. Other components of the LED display panel 600 as shown in FIG. 6 are identical or similar to those of the LED display panel 200 as shown in FIG. 2A, and are not further elaborated hereinafter.

In the LED display panel according to each of the embodiments as described above, a thickness and a width of signal lines in the second matrix circuit formed on the PCB may be greater than a thickness and a width of signal lines in the first matrix circuit formed on the flexible substrate. For example, as discussed above, FIG. 3C shows that the thickness and/or the width of the signal lines (i.e., the power lines 350') in the second matrix circuit may be greater than the thickness and/or the width of the signal lines (i.e., the data lines 320 and the scan lines 330) in the first matrix circuit.

In the LED display panel according to each of the embodiments as described above, by fabricating the circuitry of the pixel array separately on the flexible substrate and the PCB, the active matrix scan and data lines on the flexible substrate may be either bended at the folded border area, or may be connected to the bottom surface of the PCB through conductive structures in the through holes. The driving circuits, such as the data ICs, scan ICs and power ICs, can be either disposed on the folded border area of the flexible substrate at the side edge or the bottom surface of the PCB, or be disposed on the bottom surface of the PCB. Thus, a narrow boarder for the LED display panel can be achieved. Further, on the PCB, the power lines and common electrode may be fabricated using thicker and wider copper lines, which can significantly reduce the RC loading and improve heat dissipation, thus implementing a very efficient large size mosaic LED display panel.

In certain embodiments, for a large area display panel, multiple display modules are assembled together with display pixels in neighboring modules aligned in rows and columns. Because of the much reduced size of a modularized panel design, the driving of the panel becomes much easier, and the IR loss is much reduced, such that panel addressing with frame rate greater than 120 Hz becomes feasible with improved flicker performance.

Figure 7A:
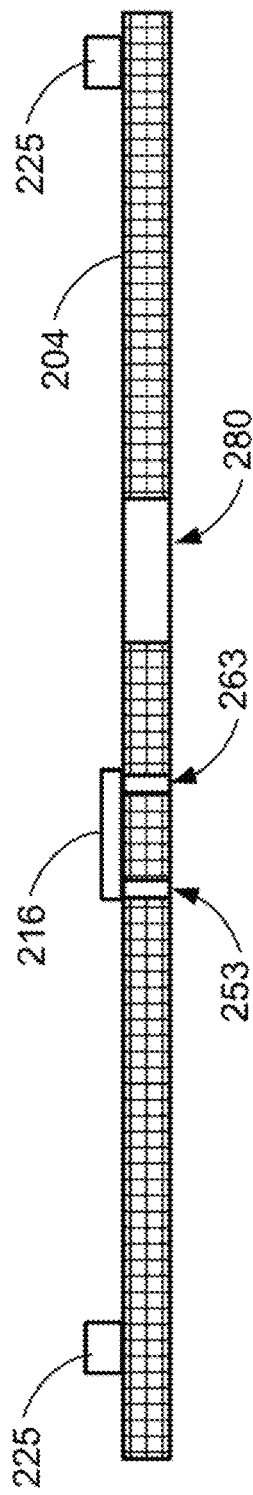

FIG. 7A to 7H show a method of forming the LED display panel as shown in FIG. 2A according to certain embodiments of the present disclosure. As shown in FIG. 7A, the flexible substrate 204 is provided, and a plurality of through holes 253, 263 and 280 are formed on the flexible substrate 204. Specifically, the through hole 253 is provided for the conductive structure 252, and the through hole 263 is provided for the conductive structure 262. The through hole 280 is provided for the conductive structures 272 and 274, which are used for connection with the LED 212. In certain embodiments, the through holes 253, 263 and 280 may be formed by etching or by laser drilling to ensure the precision of the locations thereof. Further, a part of the first matrix circuit, including the data lines, the scan lines and the pixel circuits (including the TFT 216 or the circuits as shown in FIG. 3B) are formed on the top surface of the flexible substrate 204. The data and scan driving circuits (such as the data ICs 225) are also formed at the border area on the top surface of the flexible substrate 204.

Figure 7B:
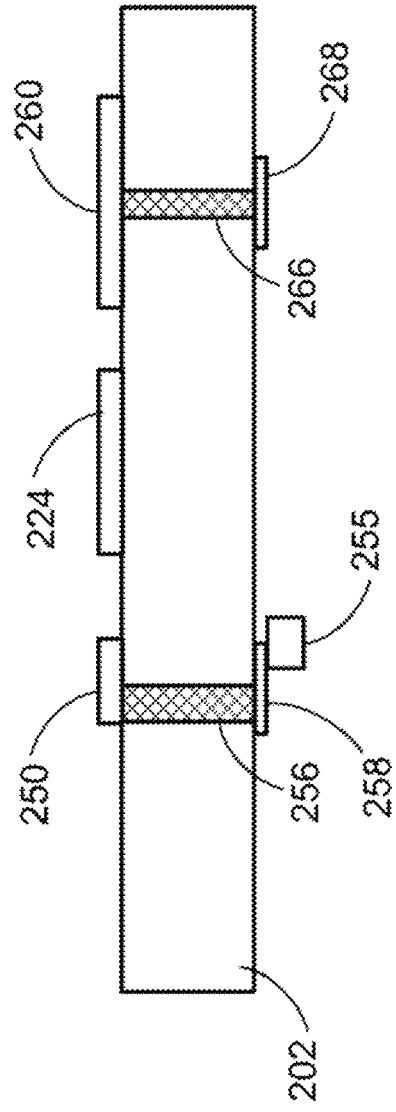

As shown in FIG. 7B, the PCB 202 is provided. Specifically, a plurality of through holes are formed on the PCB 202, and the conductive structures 256 and 266 are correspondingly formed in the through holes. Then, the second matrix circuit, including the power lines 250, the common electrode 260 and the contact electrode 224, is formed on the top surface of the PCB 202, and the power contact 258 and the ground contact 268 as well as the power IC 255 are also formed on the bottom surface of the PCB 202, such that the conductive structure 256 electrically connects the power line 250 to the power contact 258, and the conductive structure 256 electrically connects the common electrode 260 to the ground contact 268.

Figure 7E:
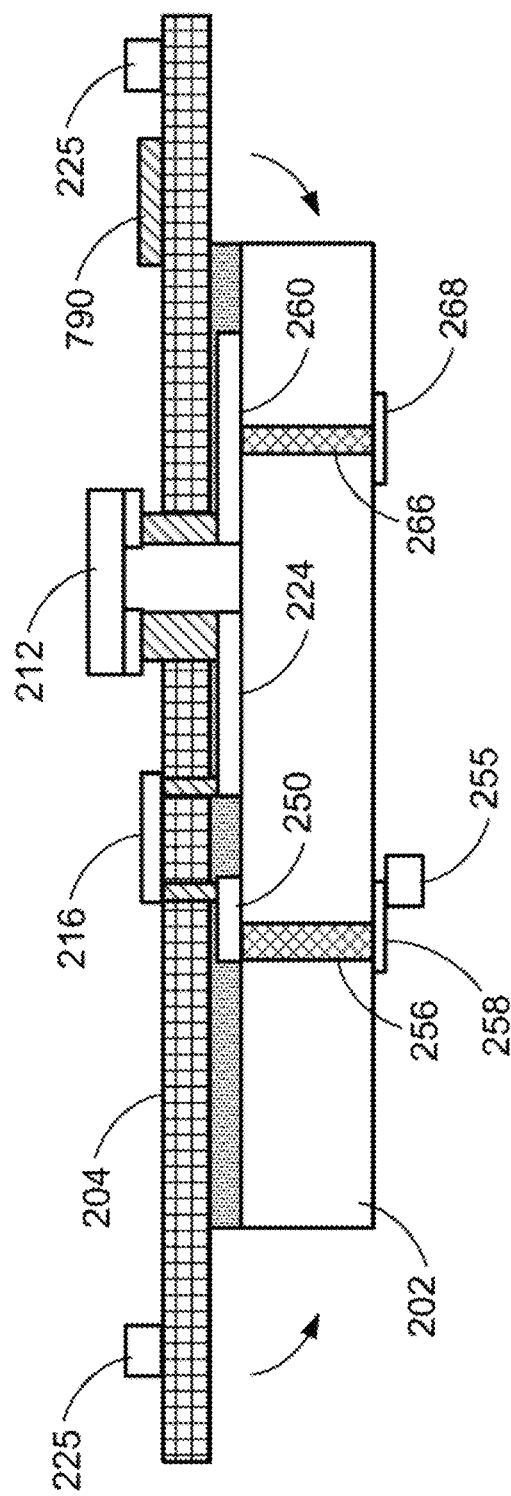

Once the flexible substrate 204 as shown in FIG. 7A and the PCB 202 as shown in FIG. 7B are provided, the flexible substrate 204 is laminated on the PCB 202 by the adhesive layer 206, as shown in FIG. 7C. Specifically, a part of the adhesive layer 206 may be disposed under the through holes 253, 263 and 280, and may be later removed in the forming of the conductive structures. Then, as shown in FIG. 7D, the conductive structures 252, 262, 272 and 274 are respectively formed in the corresponding through holes 253, 263 and 280. The conductive structures 252, 262, 272 and 274 may be formed by the same conductive material. In certain embodiments, each of the conductive structures 252, 262, 272 and 274 may be formed as a solder bump as shown in FIGS. 2E and 2F, or as a conductive dot as shown in FIGS. 2G and 2H. Then, as shown in FIG. 7E, the LED 212 may be bonded on the conductive structures 272 and 274. Once all the components are formed as shown in FIG. 7E, the border area of the flexible substrate 204 may be folded at the corresponding edges of the PCB 202 to form the LED display panel 200 as shown in FIG. 2A.

Figure 8:
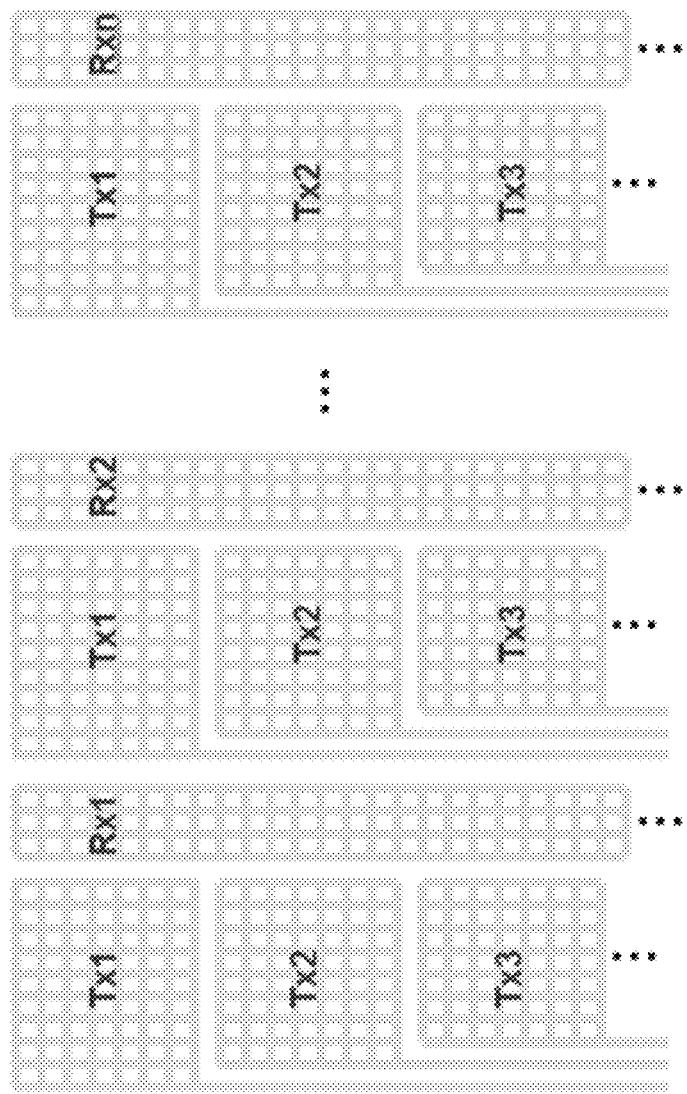
FIG. 8 schematically shows a touch sensing mesh structure according to certain embodiments of the present disclosure.

In certain embodiments, as shown in FIG. 7E, a touch sensing mesh structure 790 may be formed on the flexible substrate to provide capacitive functions, which may be used in wireless signal transmission. FIG. 8 schematically shows a touch sensing mesh structure according to certain embodiments of the present disclosure. As shown in FIG. 8, the touch sensing mesh structure includes a plurality of transmitting mesh structures Tx(n), which may be used to transmit the wireless signals, and a plurality of receiving mesh structures Rx(n), which may be used to receive the wireless signals. In certain embodiments, the touch sensing mesh structure 790 and the conductive structures 252, 262, 272 and 274 may be formed by the same conductive material.

Figure 7F:
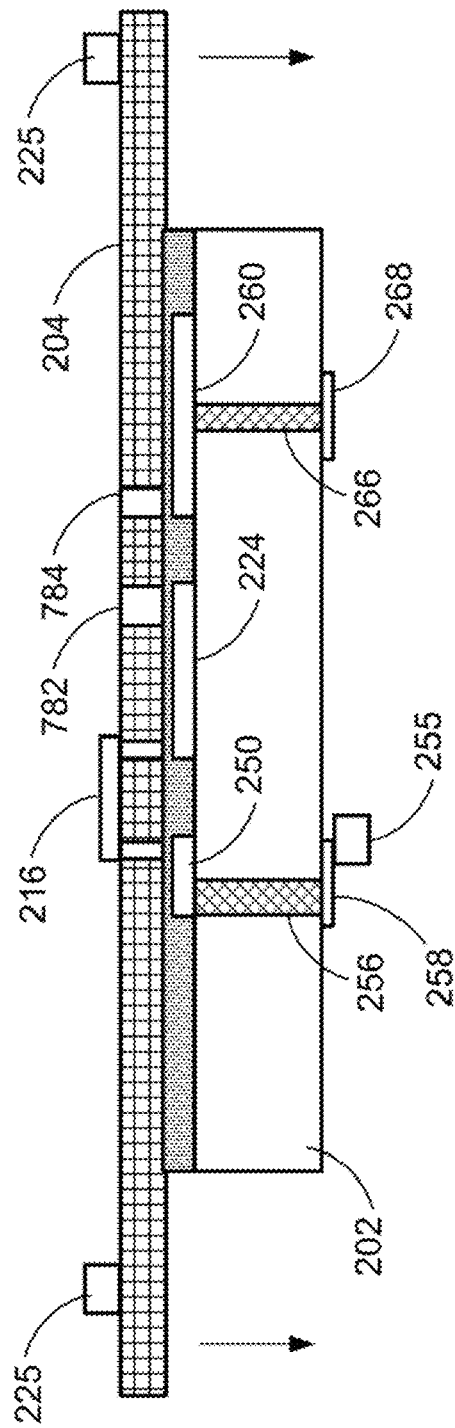
Figure 7G:
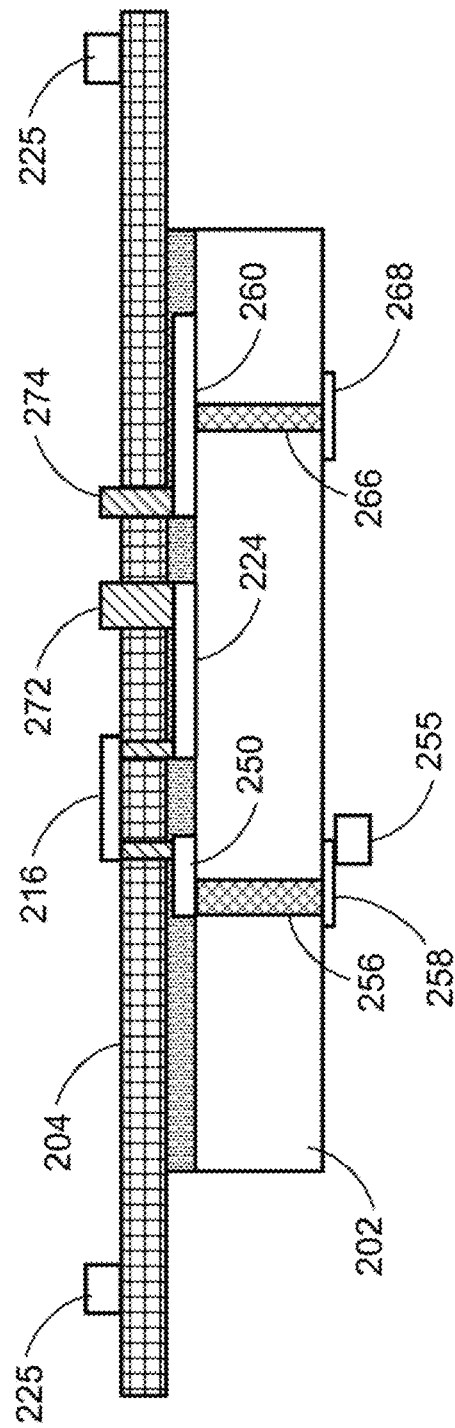

In certain embodiments, the through hole 280, which is provided for the conductive structures 272 and 274 and used for connection with the LED 212, may be formed as two separate through holes. For example, as shown in FIGS. 7F and 7G, instead of providing a single through hole 280 for the connection of the LED 212 (as shown in FIGS. 7C and 7D), two separate through holes 782 and 784 may be provided, and the conductive structures 272 and 274 may be formed respectively in the through holes 782 and 784.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A light emitting diode (LED) display panel, comprising:
    a printed circuit board (PCB);
    a flexible substrate disposed on the PCB, wherein the flexible substrate has a plurality of holes; and
    a pixel array formed by a first matrix circuit directly disposed only on the flexible substrate, a second matrix circuit directly disposed only on the PCB, and a plurality of LEDs directly disposed only on the PCB, collectively defining a plurality of pixels, wherein each of the pixels comprises a corresponding one of the LEDs and pixel circuits formed by the first matrix circuit and the second matrix circuit, and a projection of each of the LEDs correspondingly overlaps with a projection of one of the holes on the flexible substrate along an extending direction of the holes,
    wherein the first matrix circuit comprise a plurality of data lines and a plurality of scan lines, and the second matrix circuit comprises a plurality of power lines and a common electrode.

2. The LED display panel of claim 1, wherein
    the data lines extend along a first direction, and are configured to provide data signals to the pixels; and
    the scan lines extend along a second direction, and are configured to provide scan signals to the pixels.

3. The LED display panel of claim 2, wherein
    the power lines are configured to provide power to the LEDs of the pixels; and
    the common electrode is configured to be connected to a ground potential.

4. The LED display panel of claim 3, wherein the pixel circuits of each of the pixels comprise:
    a scan transistor, having a control end electrically connected to a corresponding one of the scan lines, a first end electrically connected to a corresponding one of the data lines, and a second end;
    a driving transistor, having a control end electrically connected to the second end of the scan transistor, a first end electrically connected to a corresponding one of the power lines, and a second end; and
    a storage capacitor having a first electrode electrically connected to the second end of the scan transistor, and a second electrode electrically connected to the first end of the driving transistor,
    wherein the corresponding one of the LEDs of each of the pixels has one of two electrodes electrically connected to second end of the driving transistor, and the other of the two electrodes electrically connected to the common electrode to be connected to the ground potential.

5. The LED display panel of claim 4, wherein for each of the pixels, the flexible substrate has a first through hole correspondingly located at a contact electrically connected to the first end of the driving transistor and a second through hole correspondingly located at a contact electrically connected to the second end of the driving transistor, a first conductive structure is formed in the first through hole to electrically connect the first end of the driving transistor to the corresponding one of the power lines, and a second conductive structure is formed in the second through hole to electrically connect the second end of the driving transistor to one of the two electrodes of the corresponding one of the LEDs.

6. The LED display panel of claim 5, wherein for each of the pixels, a touch sensing mesh structure is disposed on the flexible substrate, and the touch sensing mesh structure, the first conductive structure and the second conductive structure are formed by a same conductive material.

7. The LED display panel of claim 5, wherein the first conductive structure and the second conductive structure are formed by a plurality of solder bumps on the PCB.

8. The LED display panel of claim 5, wherein the first conductive structure and the second conductive structure are formed by a plurality of conductive dots deposited in the first through hole and the second through hole.

9. The LED display panel of claim 3, further comprising at least one scan driving circuit and at least one data driving circuit, wherein the scan lines are electrically connected to the at least one scan driving circuit, the data lines are electrically connected to the at least one data driving circuit, and the at least one scan driving circuit and the at least one data driving circuit are disposed in a border area of the flexible substrate.

10. The LED display panel of claim 9, wherein at least one side of the border area of the flexible substrate is folded at an edge of the PCB.

11. The LED display panel of claim 3, wherein the data lines and the scan lines of the first matrix circuit are disposed on a surface of the flexible substrate directly facing the PCB, and the power lines and the common electrode of the second matrix circuit are disposed on a surface of the PCB directly facing the flexible substrate.

12. The LED display panel of claim 11, further comprising at least one scan driving circuit and at least one data driving circuit, wherein the at least one data driving circuit are disposed on a back surface of the PCB not facing the flexible substrate, and the PCB has a plurality of third through holes correspondingly located at each of the at least one data driving circuit, and a plurality of third conductive structures are formed in the third through holes to electrically connect the data lines to the at least one data driving circuit.

13. The LED display panel of claim 1, wherein a thickness and a width of signal lines in the second matrix circuit are greater than a thickness and a width of signal lines in the first matrix circuit.

14. A mosaic LED display panel formed by a plurality of LED display modules butted together, wherein each of the LED display modules is the LED display panel of claim 1.

15. The mosaic LED display panel of claim 14, wherein an integral PCB is configured to function as the PCB of each of the LED display modules, and the flexible substrates of the LED display modules are all bonded to the integral PCB.

16. A method of forming a light emitting diode (LED) display panel, comprising:

providing a flexible substrate, having a plurality of holes, a plurality of first through holes and a plurality of second through holes;

forming a first matrix circuit directly on the flexible substrate, wherein the first matrix circuit comprise a plurality of data lines and a plurality of scan lines;

providing a printed circuit board (PCB);

forming a second matrix circuit directly on the PCB, wherein the second matrix circuit comprises a plurality of power lines and a common electrode, the first matrix circuit is directly disposed only on the flexible substrate, and the second matrix circuit is directly disposed only on the PCB;

laminating the flexible substrate and the PCB together;

forming, by a same conductive material, a plurality of first conductive structures in the first through holes, a plurality of second conductive structures in the second through holes, and a plurality of third and fourth conductive structures in the holes; and bonding a plurality of LEDs to the third and fourth conductive structures, wherein the first matrix circuit, the second matrix circuit and the LEDs collectively form a pixel array defining a plurality of pixels, and each of the pixels comprises a corresponding one of the LEDs and pixel circuits formed by the first matrix circuit and the second matrix circuit.

17. The method of claim 16, wherein the first matrix circuit further comprises:

at least one scan driving circuit and at least one data driving circuit disposed in a border area of the flexible substrate;

wherein the data lines extend along a first direction and are electrically connected to the at least one data driving circuit, and are configured to provide data signals to the pixels;

wherein the scan lines extend along a second direction and are electrically connected to the at least one scan driving circuit, and are configured to provide scan signals to the pixels;

wherein the power lines are configured to provide power to the LEDs of the pixels; and wherein the common electrode is configured to be connected to a ground potential.

18. The method of claim 17, further comprising:

folding at least one side of the border area of the flexible substrate at an edge of the PCB.

19. The method of claim 17, wherein the pixel circuits of each of the pixels comprise:

a scan transistor, having a control end electrically connected to a corresponding one of the scan lines, a first end electrically connected to a corresponding one of the data lines, and a second end;

a driving transistor, having a control end electrically connected to the second end of the scan transistor, a first end electrically connected to a corresponding one of the power lines, and a second end; and a storage capacitor having a first electrode electrically connected to the second end of the scan transistor, and a second electrode electrically connected to the first end of the driving transistor, wherein the corresponding one of the LEDs of each of the pixels has one of two electrodes electrically connected to second end of the driving transistor, and the other of the two electrodes electrically connected to the common electrode to be connected to the ground potential; and wherein for each of the pixels, a corresponding one of the first through holes is correspondingly located at a contact electrically connected to the first end of the driving transistor, a corresponding one of the second through holes is correspondingly located at a contact electrically connected to the second end of the driving transistor, a corresponding one of the first conductive structures is formed in the corresponding one of the first through holes to electrically connect the first end of the driving transistor to the corresponding one of the power lines, and a corresponding one of the second conductive structures is formed in the corresponding one of the second through holes to electrically connect the second end of the driving transistor to the one of the two electrodes of the corresponding one of the LEDs.

* * * * *